US008065598B1

(12) United States Patent
Gunnam et al.

(10) Patent No.: US 8,065,598 B1
(45) Date of Patent: Nov. 22, 2011

(54) LOW LATENCY PROGRAMMABLE ENCODER WITH OUTER SYSTEMATIC CODE AND LOW-DENSITY PARITY-CHECK CODE

(75) Inventors: Kiran Gunnam, San Jose, CA (US); Farshid Rafiee Rad, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 943 days.

(21) Appl. No.: 12/024,720

(22) Filed: Feb. 1, 2008

Related U.S. Application Data

(60) Provisional application No. 60/888,852, filed on Feb. 8, 2007.

(51) Int. Cl.
*G06F 11/00* (2006.01)
(52) U.S. Cl. ...................................................... 714/800
(58) Field of Classification Search .................. 714/746, 714/752, 755, 782, 784, 800–801
See application file for complete search history.

(56) References Cited

U.S. PATENT DOCUMENTS

| | | | |
|---|---|---|---|
| 6,789,227 B2 | 9/2004 | De Souza et al. | |
| 6,961,888 B2 | 11/2005 | Jin et al. | |
| 6,990,625 B2 * | 1/2006 | Fujiwara et al. | 714/788 |
| 7,178,082 B2 * | 2/2007 | Yu et al. | 714/752 |
| 7,234,098 B2 | 6/2007 | Eroz et al. | |
| 7,516,389 B2 * | 4/2009 | Song | 714/755 |
| 7,904,792 B2 * | 3/2011 | Kim et al. | 714/774 |

OTHER PUBLICATIONS 802.16e: IEEE Standard for Local and metropolitan area networks Part 16: Air Interface for Fixed and Mobile Broadband Wireless Access Systems Amendment for Physical and Medium Access Control Layers for Combined Fixed and Mobile Operation in Licensed Bands, pp. 1-822 (Feb. 2006).

IEEE P802.11n/D2.00 Draft Standard for Information Technology—Telecommunications and information exchange between systems—Specific requirements—Part 11: Wireless LAN Medium Access Control (MAC) and Physical Layer (PHY) specifications: Amendment <number>: Enhancements for Higher Throughput, pp. 1-476 (Feb. 2007).

* cited by examiner

*Primary Examiner* — Shelly A Chase

(57) ABSTRACT

Low-latency programmable encoders, and more particularly, low-latency programmable encoders which use low-density parity check (LDPC) codes in combination with an outer systematic code. The LDPC encoder is programmable for any irregular circulant-based LDPC code. The code profile, block length, number of block rows, and number of block columns can vary. The LDPC encoding and the outer systematic code encoding can proceed in a parallel manner (e.g., simultaneously) instead of in a serial manner.

20 Claims, 18 Drawing Sheets

$$
300 \quad \overbrace{\begin{bmatrix} 0 & 0 & 0 & 0 & 0 & 0 & 0 & 0 & 1 & 0 & 0 \\ 0 & 0 & 0 & 0 & 0 & 0 & 0 & 1 & 0 & 0 & 0 \\ 0 & 0 & 0 & 0 & 0 & 0 & 1 & 0 & 0 & 0 & 0 \\ 0 & 0 & 0 & 0 & 0 & 1 & 0 & 0 & 0 & 0 & 0 \\ 0 & 0 & 0 & 0 & 1 & 0 & 0 & 0 & 0 & 0 & 0 \\ 0 & 0 & 0 & 1 & 0 & 0 & 0 & 0 & 0 & 0 & 0 \\ 0 & 0 & 1 & 0 & 0 & 0 & 0 & 0 & 0 & 0 & 0 \\ 0 & 1 & 0 & 0 & 0 & 0 & 0 & 0 & 0 & 0 & 0 \\ 0 & 0 & 0 & 0 & 0 & 0 & 0 & 0 & 0 & 1 & 0 \\ 0 & 0 & 0 & 0 & 0 & 0 & 0 & 0 & 1 & 0 & 0 \end{bmatrix}}^{302}\Bigg\}304
$$

FIG. 3A $$
\begin{bmatrix}
11 & -1 & 8 & 13 & 12 & 15 & 0 & -1 & -1 & -1 \\
6 & 10 & -1 & 3 & 12 & -1 & 0 & -1 & -1 & -1 \\
7 & 13 & 7 & -1 & -1 & 0 & -1 & 0 & -1 & -1 \\
4 & 4 & 5 & 4 & -1 & -1 & -1 & -1 & 0 & 0 \\
3 & 14 & 1 & -1 & 15 & 15 & -1 & -1 & -1 & 0
\end{bmatrix}
$$

LOW LATENCY PROGRAMMABLE ENCODER WITH OUTER SYSTEMATIC CODE AND LOW-DENSITY PARITY-CHECK CODE

CROSS-REFERENCE TO RELATED APPLICATIONS

This claims the benefit under 35 U.S.C. §119(e) of U.S. Provisional Application No. 60/888,852 filed Feb. 8, 2007, which is hereby incorporated herein by reference in its entirety.

BACKGROUND OF THE INVENTION

The disclosed technology relates generally to data processing, and more particularly to low-latency programmable encoders.

With the continuing demand for high-reliability transmission of information in digital communication and storage systems, and with the rapid increase in available computational power, various coding and decoding techniques have been investigated and applied to increase the fidelity of these systems. One such coding technique, low-density parity check (LDPC) coding, was first proposed in the 1960s, but was not used until the late 1990s when researchers began to investigate iterative coding and decoding techniques.

LDPC codes are among the few known error control coding techniques capable of transmitting information at a rate close to the Shannon limit or channel-capacity. Currently, LDPC codes are considered to be the next-generation communication system encoding standard. LDPC codes can be regular or irregular, have a linear or cyclic encoding matrix, and can be decoded in a myriad of ways, ranging in complexity and error performance. LDPC codes can also be encoded quite simply because LDPC coding and decoding are generally performed iteratively, reducing the memory requirements for an LDPC encoder. For example, an LDPC encoder is typically implemented using linear or cyclic shift registers, in which the results of the LDPC encoder block matrix-vector multiplication are accumulated in a memory buffer at each calculation step. In particular, the encoding algorithm may be implemented on data processing circuitry, such as a field-programmable gate array (FPGA) or application specific integrated circuit (ASIC). Thus, many LDPC encoders are also programmable, making it easy to change encoding parameters, such as block length or code rate, without having to re-design (or re-build) the LPDC encoders.

However, there are a few concerns with LDPC codes. Lengthy LDPC codes may require large memory buffers and/or computational power, even when the parity-check matrix may be sparse. In addition, the error floor of LDPC codes may be a concern; usually this error floor is high. It may be difficult to implement a low error floor LDPC code without making the code block length large. As mentioned above, if the code block length is large, the LDPC codes may require larger memory buffers. This may be especially true in devices with programmable encoders—e.g., encoders that are operable over a wide range of parameters such as block length, number of block rows, number of block columns, and code rate.

A possible solution for lowering the error floor of an LDPC code may be to use an outer systematic code, such as a Reed-Solomon (RS) or Bose-Chaudhuri-Hocquenghem (BCH) code. However, such codes are typically implemented in a serial manner. For example, a message to be encoded may be first encoded with an outer BCH code, and the resulting code can then be encoded as an LDPC code. Such serially-implemented encoding systems, however, typically require multiple memory buffers and have high latency—e.g., the latency (or time delay in number of codewords) may be as high as 2-3 codewords.

SUMMARY OF THE INVENTION

In accordance with the principles of this invention, systems and methods for low-latency programmable encoders which use LDPC codes in combination with an outer systematic code, for example an RS or BCH code, are provided. Generally, in one aspect, the encoder may be implemented in part of the resources or memory of a field programmable gate array (FPGA) or an application specific integrated circuit (ASIC).

In one embodiment of the present invention, an LDPC encoder may generate a codeword based on a suitable LDPC code. The codeword may have a message segment corresponding to the original message symbols, an outer code parity segment corresponding to the parity bits generated by an outer encoder (e.g., BCH encoder), and an LDPC parity segment that is generated by the LDPC encoder. The LDPC code used by the LDPC encoder can be associated with a parity check matrix that is decomposed into three portions: a corresponding message portion, outer code parity portion, and LDPC parity portion.

To produce the LDPC parity segment, the LDPC encoder can first process the message segment based on the message portion of the parity check matrix. For example, the LDPC encoder may perform a matrix-vector multiplication with the message portion and the message segment. The LDPC encoder may then process the outer code parity segment based on the outer code parity portion subsequent to processing the message segment. For example, the LDPC encoder may perform a matrix-vector multiplication with the outer code parity portion and the outer code parity segment.

The LDPC encoder can then generate the LDPC parity segment from the processed message segment and processed outer code parity segment based on the LDPC parity portion. In some embodiments, the LDPC encoder may combine the two matrix-vector products to produce a complete matrix-vector product that is representative of the entire data input portion of the parity check matrix. The LDPC parity segment may comprise a parity segment generated by the LDPC encoder that can be appended to the input message vector to obtain a systematic LDPC codeword.

In some embodiments of the present invention, the LDPC encoder may be programmable for any irregular circulant-based LDPC code. For example, the code profile, block length, number of block rows, and number of block columns can be programmable.

In some embodiments, the LDPC encoding and the outer systematic code encoding can proceed in a parallel manner, i.e., the LDPC encoding and outer system code encoding can occur simultaneously, instead of in a serial manner. This parallel processing may reduce the memory and latency requirements for system. In an exemplary embodiment of the system, such a parallel operability may be enabled by computational and memory update mechanisms for the block matrix-vector multiplication in the LDPC encoder. That is, the LDPC encoder can operate initially without knowledge of the outer code parity bits (e.g., using only the message portion of the parity check matrix) and may add the outer code parity bits into the computation (e.g., using the outer code parity portion of the parity check matrix) once these bits are made available.

In an exemplary embodiment of the system, the LDPC encoder and outer systematic encoder can interface together without additional memory buffers or excessive latency as would be required if the two encoders were operating in a serial manner. Both the LDPC encoder and the outer systematic code encoder may read from the same input buffer, where both the LDPC encoder and outer systematic code encoder may begin operating on a stored message at the same time. The outer systematic code encoder may then store the outer code parity bits back into the input buffer upon completion of an encoding process so that the outer code parity bits can be made available to the LDPC encoder. In some embodiments, without the memory latency, the latency of the overall encoding process may be only one code word.

In some embodiments, an encoder for generating a codeword from message symbols based on a concatenated code is provided. This encoder may comprise an outer systematic code encoder for calculating a first set of parity symbols from the message symbols, an inner systematic code encoder for computing a second set of parity symbols from the message symbols and the first set of parity symbols, and an output unit which may generate the codeword from the first and second set of parity symbols. The inner systematic code encoder may operate based on the message symbols while the outer systematic code encoder generates the first set of parity symbols.

The outer systematic code encoder may be operable to encode the message symbols using a Bose-Chaudhuri-Hocquenghem (BCH) code, while the inner systematic code encoder may be operable to encode the message symbols and the first set of parity symbols using a low-density parity check (LDPC) code. In some embodiments, the inner systematic code encoder may have programmable code parameters, and the inner systematic code encoder may generate the second set of parity symbols based on a current setting of the code parameters. The code parameters of the inner systematic code encoder can include at least one of a block length, a number of block rows, a number of block columns, and a code rate.

In some exemplary embodiments, the encoder may include an input buffer for storing the message symbols such that the inner code encoder and the outer code encoder can be configured to read from the input buffer to obtain the message symbols. Optionally, the outer systematic code encoder may be configured to store the first set of parity symbols in the input buffer with the message symbols, and the inner systematic code encoder may be configured to read from the input buffer to obtain the first set of parity symbols. The output unit may be configured to obtain the first set of parity symbols and the message symbols from the input buffer, and may obtain the second set of parity symbols from the inner systematic code encoder.

In some embodiments, the inner systematic code encoder may include an inner code control ROM for storing one or more parity check matrices associated with the inner systematic code, an inner code control unit that may interface with the inner code control ROM, and an inner code computation unit for computing the second set of parity symbols. The inner code control unit may select portions of one of the one or more parity check matrices that the inner code computation unit can use to compute the second set of parity symbols.

The inner systematic code encoder may be associated with a parity check matrix having a data portion and an outer code parity portion. Optionally, the inner code encoder may be configured to compute a first vector-matrix multiplication between the data portion and a vector of the message symbols while the outer systematic code encoder generates the first set of parity symbols. The inner code encoder may then compute a second vector-matrix multiplication between the outer code parity portion and a vector of the first set of parity symbols.

In some embodiments, a method for generating a codeword from message symbols is provided. This method may comprise calculating a first set of parity symbols from the message symbols using an outer code in a first time interval and computing a second set of parity symbols from the message symbols and the first set of parity symbols using an inner code. In one embodiment, computing the second set may include computing intermediate symbols based on the message symbols during the first time interval, updating the intermediate symbols based on the first set of parity symbols in a second time interval subsequent to the first time interval, and generating the codeword from the first and second set of parity symbols. The updated set of intermediate symbols may be usable to produce the second set of parity symbols.

In some embodiments, the method for generating a codeword may involve computing the first set of parity symbols based on a Bose-Chaudhuri-Hocquenghem (BCH) code, and computing the second set of parity symbols based on a low-density parity check (LDPC) code.

In some embodiments, the method may involve storing the message symbols in an input buffer. In some embodiments, calculating the first set of parity symbols may comprise obtaining the message symbols from the input buffer, computing the first set of parity symbols from the obtained message symbols, and storing the first set of parity symbols in the input buffer with the message symbols. Optionally, computing the second set of parity symbols may comprise obtaining the message symbols from the input buffer, computing the intermediate symbols based on the obtained message symbols during the first time interval, obtaining the first set of parity symbols from the input buffer during the second time interval, and updating the intermediate symbols based on the obtained first set of parity symbols.

The inner code may be associated with a parity check matrix having a data portion and an outer code parity portion. In some embodiments, computing the intermediate symbols may include computing a first matrix-vector multiplication of the data portion with a vector of the message symbols. Updating the intermediate symbols may comprise computing a second matrix-vector multiplication of the outer code parity portion with a vector of the first set of parity symbols.

BRIEF DESCRIPTION OF THE DRAWINGS

The above and other aspects and advantages of the invention will be apparent upon consideration of the following detailed description, taken in conjunction with the accompanying drawings, in which like reference characters refer to like parts throughout, and in which:

FIG. 3A is an illustrative circulant matrix;

FIG. 3B is a mother matrix corresponding to a parity check matrix for an irregular quasi-cyclic circulant-based low-density parity check code;

FIG. 3C is a portion of a mother matrix representation of a parity check matrix for a quasi-cyclic parity check matrix for a particular low-density parity check code;

DETAILED DESCRIPTION OF THE INVENTION

The systems and methods of the invention generally relate to low-latency programmable encoders which use LDPC codes in combination with an outer systematic code. The LDPC and outer-systematic codes may represent one class of codes, called error-correction codes (ECC), that may be used to detect and/or correct errors. Error correcting codes are often used to correct errors which may occur during transmission or storage. Thus, the disclosed encoders would be desirable in high-reliability digital communication or storage systems in which low-latency and low memory buffering are desired. As used herein, encoding may generally refer to the process of generating data in a manner that facilitates subsequent detection and/or correction of errors in the data, while decoding may generally refer to the counterpart process of detecting and/or correcting the errors.

Figure 1:
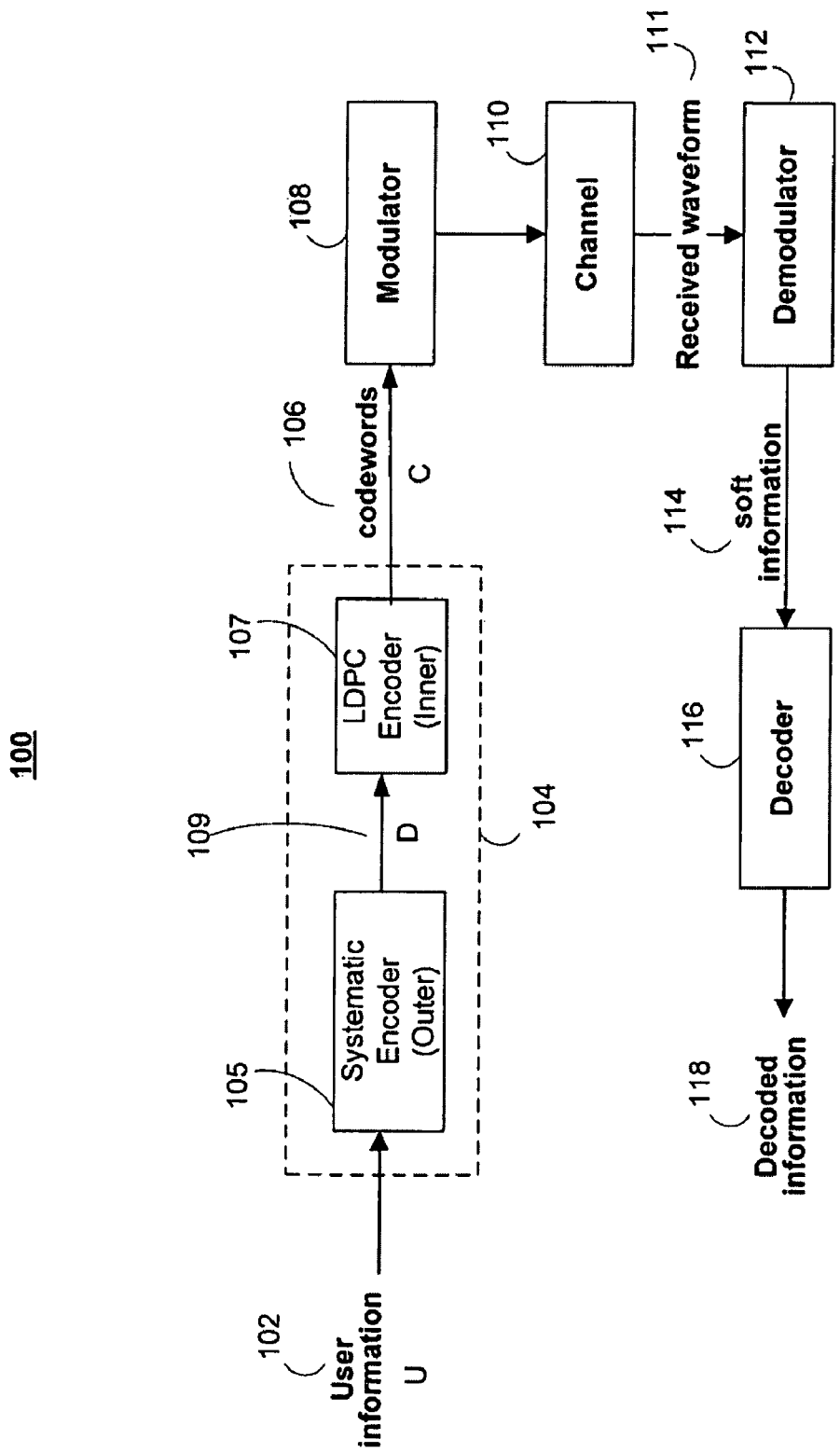
FIG. 1 is an illustrative communication/data storage system that utilizes the disclosed error-correction encoders for encoding data.

FIG. 1 shows an illustrative communication or data storage system 100 that utilizes error-correction codes for achieving reliable communication or storage. User information 102, or U, is encoded through encoder 104. User information 102, often referred to as the message information or a message vector, may be grouped into units of k symbols, where each symbol may be binary, ternary, quaternary, or any other suitable type of data. However, for simplicity, embodiments of the present invention will be described in terms of binary bits. In the process of encoding user information 102, different codes can be used by encoder 104 to achieve different results.

Encoder 104 may encode user information 102 using low-density parity check (LDPC) codes with outer systematic codes. Thus, encoder 104 may be composed of two encoders: systematic encoder 105, which generates a systematic codeword 109 from user information 102, and LDPC encoder 107, which generates codeword 106 from systematic codeword 109. Thus, the ECC code employed by encoder 104 is an example of a concatenated code, i.e., a code which is generated from combining multiple codes. For a concatenated code based on two codes, such as the concatenated code employed by encoder 104, the two codes may be referred to as an outer code and an inner code. Systematic encoder 105 can employ the outer code, which is the first code applied to user information 102 (or the message vector), to produce outer systematic codeword 109, i.e., the outer codeword or outer codeword vector. LDPC encoder 107 can employ the inner code, which is the second code applied to user information 102, to produce codeword 106, i.e., the inner codeword (or inner codeword vector). For convenience, an outer codeword may sometimes be referred to by the symbol D, the length of an outer codeword (e.g., outer codeword 109) may be referred to by the symbol, $n_{outer}$, and the length of an inner codeword (e.g., codeword 106) may be referred to by the symbols, $n_{inner}$ or n.

In some exemplary embodiments, systematic encoder 105 may encode user information 102 based on a BCH code, but systematic encoder 105 may instead encode user information 102 using any other systematic error correcting code. The result of encoding user information 102 is codeword 106. Codeword 106 may be of a predetermined length, which may be referred to as n.

In one implementation, codeword 106 is passed to a modulator 108. Modulator 108 prepares codeword 106 for transmission on channel 110. Modulator 108 may use phase-shift keying, frequency-shift keying, quadrature amplitude modulation, or any suitable modulation technique to modulate codeword 106 into one or more information-carrying signals. Channel 110 may be an asymmetric or symmetric channel. Channel 110 may represent media through which the information-carrying signals travel. For example, channel 110 may represent a wired or wireless medium in a communication system, or an electrical (e.g., RAM, ROM), magnetic (e.g., a hard disk), or optical (e.g., CD or DVD) storage medium in which the information-carrying signals can be stored.

Received waveform 111 may be demodulated with demodulator 112. Demodulator 112 can demodulate received waveform 111 with filters, multiplication by periodic functions, or any suitable demodulation technique corresponding to the type of modulation used in modulator 108. Note that received waveform 111 may be subject to noise and, therefore, the resulting soft information 114 (or soft estimate of user information 102) may contain errors.

Resulting soft information 114 may be processed by decoder 116. Decoder 116 can be used to correct or detect errors in soft information 114. Decoder 116 may use iterative message-passing decoding, syndrome decoding, or any suitable decoding technique corresponding to the error-correction code used in encoder 104. For example, as soft information 114 may correspond to data encoded by an outer systematic code and an inner LDPC code, decoder 116 can include a corresponding LDPC decoder and systematic code decoder that operate using any suitable decoding technique. For the LDPC decoder, decoder 116 may use belief propagation to decode soft information 114, for example. Once decoder 116 has decoded the soft information 114, decoder 116 outputs decoded information 118.

Figure 2:
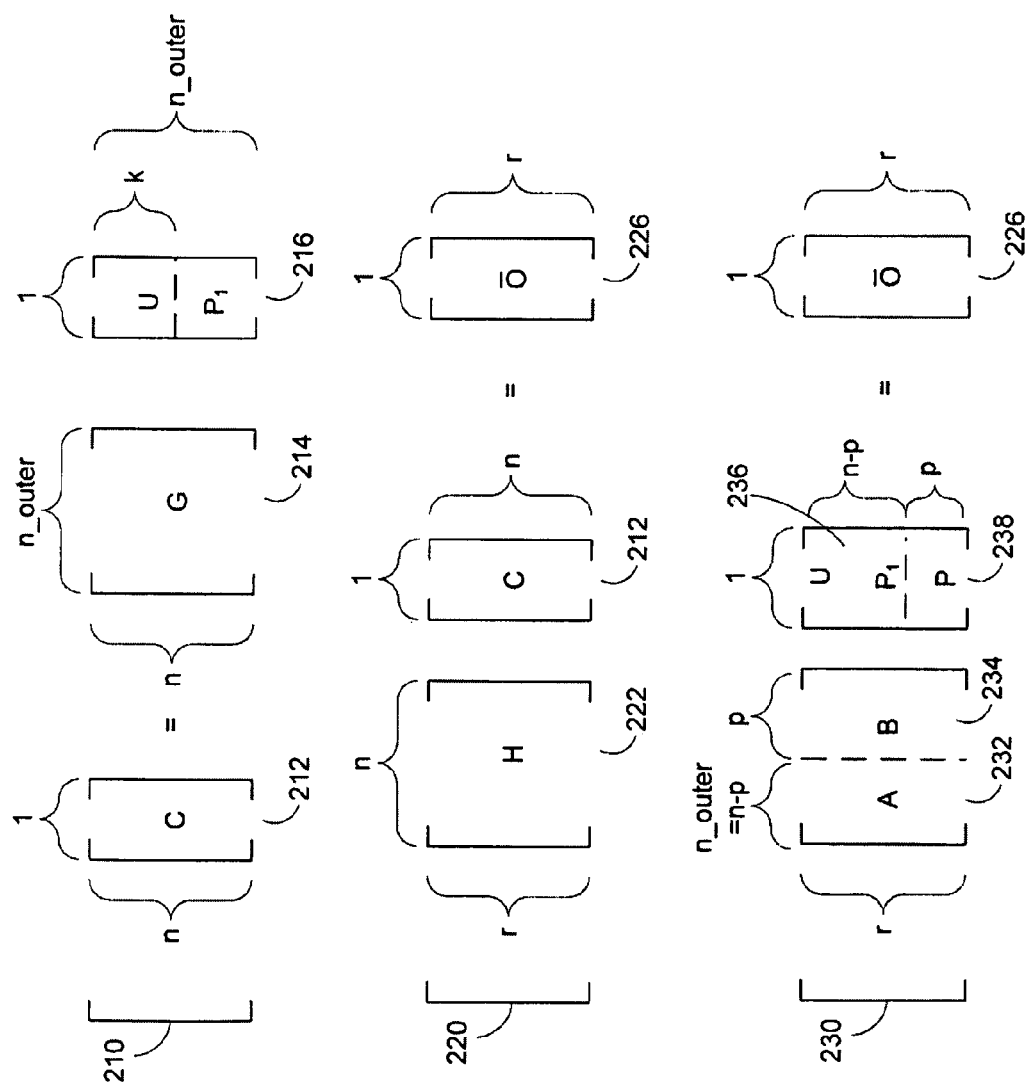
FIG. 2 is a mathematical vector model of encoding using a low-density parity check code with an outer systematic code.

FIG. 2 shows a mathematical vector model of a codeword produced by, for example, LDPC encoder 107 of FIG. 1. In particular, FIG. 2 provides a representation of an illustrative LDPC codeword vector 212 of an LDPC code. LDPC codeword vector 212 may be an inner codeword vector that is generated from encoding an outer codeword vector 216 (e.g., a BCH-encoded message) using the LDPC code. The LDPC code may be a regular (similar weighting on each row or column of parity check matrix 222) or an irregular (different weightings on each row or column of parity check matrix 222) low-density parity check code. Equation 210 illustrates the construction of LDPC codeword vector 212 from an outer codeword vector 216. Outer codeword vector 216 may be the codeword vector produced by systematic encoder 105 of FIG. 1 (e.g., outer codeword 109), and may be $n_{outer}$ bits long. As illustrated in equation 210, outer codeword vector 216 may be in systematic form. That is, outer codeword vector 216 may include the original message bits as well as additional outer code parity bits, sometimes referred by the symbol, $P_1$. Thus, outer codeword vector 216 may be a concatenation of the user information 102 (or U), and the outer systematic parity bits, $P_1$.

LDPC codeword vector 212 may include n data bits. LDPC codeword vector 212 may be constructed by multiplying generator matrix 214 by outer codeword vector 216. The resulting LDPC codeword vector 212 may be codeword 106 depicted in FIG. 1. The generator matrix 214 may be a matrix of size n by $n_{outer}$ that defines the characteristics of an error control code and may be in a systematic form. In systematic form, LDPC codeword vector 212 is a vector concatenation of user information 102 or U, the outer systematic parity bits $P_1$ of the outer systematic code generated by encoder 105, and the LDPC parity bits generated by LDPC encoder 107. The LDPC parity bits may sometimes be referred to by the symbol, $P_2$, or simply P. Alternatively, LDPC codeword vector 212 may be viewed as a vector concatenation of the LDPC encoder input (e.g., the outer codeword composed of U and $P_1$) and the LDPC parity bits, P.

LDPC codes are conventionally expressed in terms of a parity check matrix, H. Equation 220 illustrates parity check matrix 222 of the LDPC code employed by, for example, LDPC encoder 107 of FIG. 1. Parity check matrix 222 may be a matrix of size r by n. Parity check matrix contains r parity check equations, where r satisfies the inequality $r \geq n-k$. When parity check matrix 222 is multiplied by LDPC codeword vector 212, the result is a zero vector 226 of size r. Additionally, the parity check matrix 222 may be any matrix that produces a null matrix, or a matrix of all zeros, of size r by k when multiplied by the generator matrix 214. Thus, the parity check matrix may not be unique, and may be chosen based on the most computationally convenient representation of the parity check matrix 222. In particular, the parity check matrix 222 for a LDPC code is known to be sparse, meaning that the number of non-zero elements in the parity check matrix 222 may be small compared to the number of zero elements.

Parity check matrix 222 can be decomposed into two sub-matrices, as illustrated in equation 230, based on two sub-vectors of LDPC codeword vector 212. Equation 230 illustrates sub-matrices 232 and 234 of parity check matrix 222, and sub-vectors 236 and 238 of LDPC codeword vector 212, for an irregular low-density parity check code. Sub-matrix 232 may be referred to as the data portion of parity check matrix 222 (or matrix A), while sub-matrix 234 may be referred to as the parity portion of parity check matrix 222 (or matrix B). The data portion A of parity check matrix 222 is the portion of this matrix that, when performing LDPC encoding, multiplies the outer codeword sub-vector D within the codeword vector C. The parity portion B of the parity check matrix is the portion of this matrix that multiplies the parity sub-vector P within codeword C. The parity portion of sub-matrix 232 may be a matrix of size r by n-p (or equivalently, r by $n_{outer}$), where p is the number of parity bits in a row of the parity portion of parity check matrix 222. Sub-matrix 234 may be a matrix of size r by p. Sub-vector 236 is the outer codeword vector, D, and therefore may includes the same information as outer codeword vector 216, namely message vector U and the outer systematic parity bits $P_1$. Sub-vector 238 is the parity vector of the LDPC code, P. As is the case in Equation 220, when parity check matrix 222 is multiplied by LDPC codeword vector 212, the result is a zero vector 226 of size r.

FIG. 2 may also be summarized in terms of matrix-vector equations, which may also be a mathematical representation of the LDPC encoder 107 of FIG. 1. For instance, the product of the generator matrix G and the outer codeword vector [U $P_1$] results in codeword C as shown in EQ. 1:

$$C = GU \quad \text{(EQ. 1)}$$

The product of parity-check matrix H and codeword C is a zero vector as shown in EQ. 2:

$$HC = \overline{0} \quad \text{(EQ. 2)}$$

Parity-check matrix H can be partitioned into a data portion A and a parity portion B as follows:

$$H = [A|B] \quad \text{(EQ. 3)}$$

Codeword C can be partitioned into a message vector U, outer systematic parity bits $P_1$, which may be generated by the outer systematic encoder 105 of FIG. 1, and parity vector $P_2 = P$, which may be generated by the LDPC encoder 107 of FIG. 1, as shown in EQ. 4:

$$C = \begin{bmatrix} U \\ P_1 \\ P_2 \end{bmatrix} \quad \text{(EQ. 4)}$$

The outer systematic code used by systematic encoder 105 may be an RS code, a BCH code, or any other systematic ECC. As mentioned above, the parity vector $P_2$, specified by the LDPC encoder 107 of FIG. 1, can simply be written as P (i.e. $P = P_2$), as shown in EQ. 5:

$$C = \begin{bmatrix} U \\ P_1 \\ P \end{bmatrix} \quad \text{(EQ. 5)}$$

In this case, as described above, U is the message vector and $P_1$ is a vector of parity symbols specified by the outer systematic code, e.g., a BCH code.

Codeword C may be an example of codeword 106 generated by the encoder 104 of FIG. 1. As used herein, the vector, X, may be defined as the matrix-vector product of the message vector U with the data portion A of the parity check matrix H, or $$AD = X \quad \text{(EQ. 6)}$$

Equation 230 of FIG. 2 shows that AD and BP sum to zero. Therefore, the following equation also holds:

$$BP = X \quad \text{(EQ. 7)}$$

Thus, the parity vector P (or $P_2$ in EQ. 4) can be obtained by multiplying X with the matrix inverse of B, inv(B), as shown in EQ. 8:

$$P = P_2 = inv(B)X = B^{-1}X = X/B \quad \text{(EQ. 8)}$$

Thus, mathematically, LDPC encoder 107 of FIG. 1 may compute the parity vector P based on EQ. 8, and can generate the inner codeword vector by appending the parity vector to the outer codeword vector.

In hardware implementations of low-density parity check codes, it may be computationally desirable to have quasi-cyclic code representations. LDPC encoder 107 of FIG. 1 can be based on a parity check matrix that is quasi-cyclic. A quasi-cyclic code representation may be defined by the characteristic that the parity check matrix for that particular code is quasi-cyclic. Quasi-cyclic (QC) codes are those in which a cyclic shift of the rows of a codeword vector by M positions results in another QC codeword vector.

A quasi-cyclic matrix can be composed of circular sub-matrices known as circulants. In some embodiments, the parity check matrix (e.g., parity check matrix 222 of FIG. 2) of LDPC encoder 107 (FIG. 1) may be composed of circulants. FIG. 3A shows an illustrative circulant matrix 300 which may be included in the parity check matrix of LDPC encoder 107. Circulant 300 is a square matrix—i.e., circulant 300 has the same number of rows 302 as columns 304. This number may be referred to as the circulant size Z. In addition, circulants can have the property that for any given positive integer M<Z, any row/column of the circulant matrix can by cyclically shifted by M positions to obtain another row or column. It may be computationally beneficial to represent circulants so that the circulants have the property that a cyclic shift of any row or column by M=1 yields the adjacent row or column. This beneficial property is illustrated in circulant 300. In this scenario, circulants may be viewed as an identity matrix with a cyclic shift in the matrix's rows or columns.

Figure 3C:
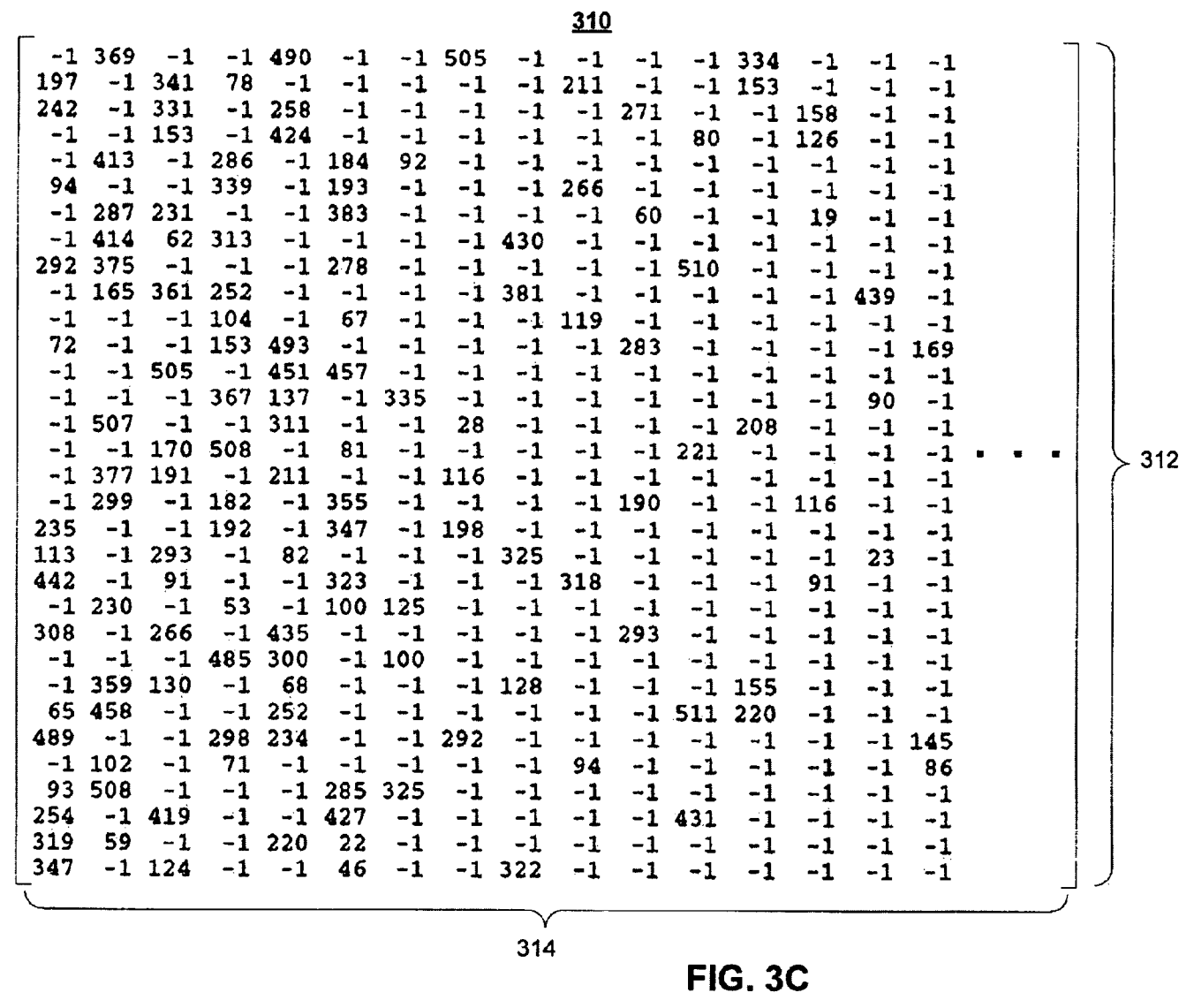

Circulant 300 of FIG. 3 may be one of many circulants included in a quasi-cyclic parity check matrix. When such a matrix is used to compute a low-density parity check code, the resulting codeword may be referred to as a quasi-cyclic (QC) circulant-based LDPC code or a QC-LDPC code. If the row-weight/column-weight, or number of non-zero elements in each row/column, of each non-zero circulant in a quasi-cyclic parity check matrix is one, the quasi-cyclic parity check matrix may be represented by a mother matrix representation. Mother matrix representations of illustrative LDPC parity check matrices are shown in FIGS. 3B and 3C. In FIGS. 3B and 3C, each entry in the mother matrix representation may correspond to an entire circulant matrix. Specifically, each entry of the mother matrix representation of a quasi-cyclic parity check matrix may indicate the shift of the '1' elements in the circulant relative to the identity matrix, i.e., the number of positions to the right of the diagonal of '1' elements of an identity matrix of size Z. For example, circulant 300 may be depicted as the entry '2' in the mother matrix representation of a quasi-cyclic parity check matrix. The entry '0' may be used to represent the identity matrix of size Z in the mother matrix representation of a quasi-cyclic parity check matrix, while an entry of '−1' may be used to represent an all-zero matrix or a null block matrix. Because each entry in the mother matrix representation of the parity check matrix represents a circulant matrix of size Z, the size of the mother matrix is $r_m = r/Z$ by $n_m = n/Z$. Note that r and n are generally chosen in such a way that $r_m$ and $n_m$ are integers.

FIG. 3B shows block matrix 305 that can be the mother matrix representation of the parity check matrix for an irregular quasi-cyclic circulant-based low-density parity check code. Such a block matrix may be used as the parity check matrix employed by LDPC encoder 107 of FIG. 1 to generate an LDPC codeword. This block matrix has 5 block rows and 10 block columns, and the circulant size for this matrix is Z=16. As described above, an entry of '−1' denotes an all-zero block matrix or a null block matrix, while other entries in block matrix 305 may represent the cyclic shifts of a 16×16 identity matrix. Note that since this matrix is for an irregular QC-LDPC code, the row and/or column weights of the block matrix may be different for different rows/columns. In particular, the first row of block matrix 305 has a weight of six and the last row of block matrix 305 has a weight of five, and therefore the rows of matrix 305 have different weights.

In some embodiments, block matrix 305 may be thought of as having two parity check matrix portions: sub-matrix 306 and sub-matrix 308. Sub-matrix 306 is the data portion of block matrix 305 which multiplies the outer codeword vector, while sub-matrix 308 is the parity portion of block matrix 305. The data portion of block matrix 305 may correspond to the A matrix in EQS. 3 and 6, or sub-matrix 232 in FIG. 2. The parity portion of block matrix 305 may correspond to the B matrix in EQS. 3 and 7, or sub-matrix 234 in FIG. 2.

FIG. 3C shows a portion of a mother matrix representation of a quasi-cyclic parity check matrix for a particular low-density parity check code, such as that which may be implemented by LDPC encoder 107 of FIG. 1. Partial mother matrix 310 has r rows 312 and $n_{outer}$ columns 314. Not all of the columns 314 are shown in mother matrix 310. Mother matrix 310 may be used in the encoding of data in a communications or data storage system such as the communications or data storage system of FIG. 1. The implementation of mother matrix 310 in the encoder and decoder may be computationally simplified, as the parity check matrix may be easily stored in memory. For example, only the first row of each circulant may need to be stored in memory. Further, if the mother matrix representation of the parity check matrix is sparse, or has very few non-zero circulants as compared to zero circulants, only the position of the '1' in the first row of each circulant may be stored in memory. Regular LDPC codes may have a smaller number of non-zero circulant matrices in their respective mother matrices than irregular LDPC codes. Thus, the mother matrices of regular LDPC codes may be computationally easier to store in memory than the mother matrices of irregular LDPC codes. Even though the memory requirement for irregular LDPC codes may be slightly greater than for regular LDPC codes, in practice, the noise-rejection capabilities of irregular LDPC codes make use of irregular LDPC codes much more popular.

Figure 4:
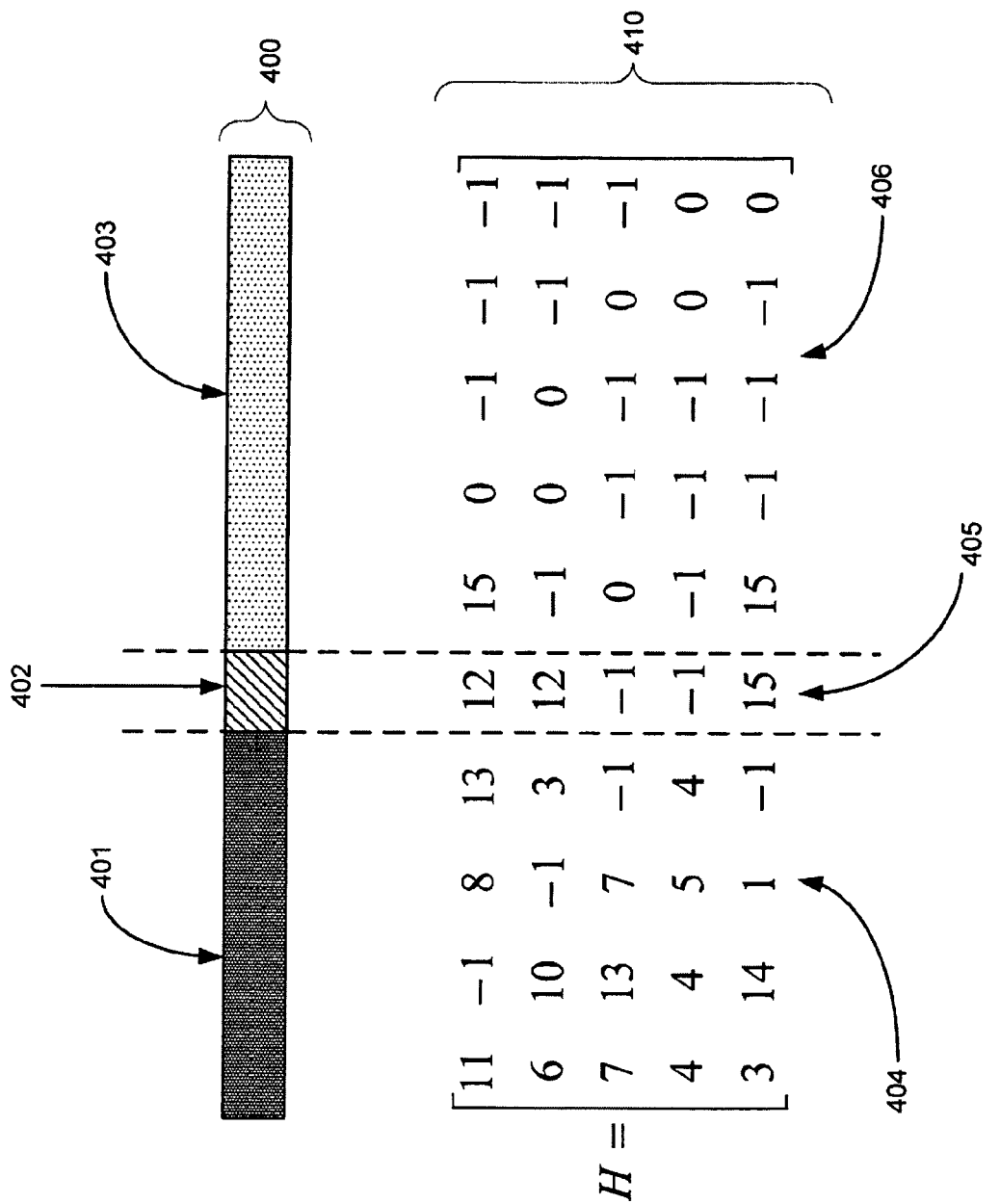
FIG. 4 is an exemplary parity check matrix and the corresponding codeword for a low-density parity check code with an outer BCH code.

As described above in connection with EQS. 4 and 5, the LDPC codeword provided by, for example, LDPC encoder 107, includes three segments—the message vector U, the parity symbols produced by the outer systematic code, $P_1$, and the symbols produced by the LDPC encoder 107, $P_2$ or P. For example, FIG. 4 shows codeword 400 for an irregular quasi-cyclic low-density parity check code with an outer BCH code that illustrates these three segments. FIG. 4 also shows an exemplary parity check matrix 410 that can be used to produce codeword 400, and may include the same components as block matrix 305 of FIG. 3B. Such a parity check matrix may be used by the LDPC encoder 107 in the data communication or storage system of FIG. 1. Codeword 400 may include the three segments (or sub-vectors) discussed above: 1) message segment U or message vector 401, 2) outer systematic code parity segment $P_1$, for example parity vector 402, and 3) LDPC parity segment $P_2$=P or LDPC parity vector 403.

These three segments may be associated with the three portions of parity check matrix 410: portions 404, 405, and 406. Portion 404 may be referred to as a message portion and is the portion of the parity check matrix that is multiplied by message segment 401. Portion 405 may be referred to as the outer code portion and is the portion of the parity check matrix multiplied by BCH parity segment 402. As shown in FIG. 3B, portion 404 and portion 405 may together be thought of as the A matrix in EQ. 3 or sub-matrix 232 of FIG. 2. Portion 406 may be the portion of matrix H that can be used to generate the LDPC parity segment of the QC-LDPC code.

LDPC parity portion 406 may represent the B matrix in EQ. 3 or sub-matrix 234 of FIG. 2.

To generate a codeword 400 from an outer systematic codeword (e.g., a BCH codeword), BCH parity segment 402 of codeword 400 may be concatenated to message vector 401. Codeword 400 can then be created by appending the LDPC parity vector 403 to the resulting combination of message vector U or 401 and BCH parity bits $P_1$ or 402. This implementation may be carried out, e.g., in an FPGA or ASIC, in the manner described below.

Parity check matrix 410 of FIG. 4 has 5 block columns in the parity portion of the matrix, and 5 block columns in the data portion of the matrix. Assuming a circulant size of 16, the number of entries that are not '−1' in the data portion (a 5×5 matrix with portions 404 and 405) of the matrix 410 is 18. In some exemplary embodiments, parity check matrix 410 of FIG. 4 may be a QC-LDPC parity check matrix for a code rate of 0.5, and thus may be used to generate codeword 400 of length 160. For example, assuming that message vector U or 401 is 64 bits long, the outer systematic BCH parity vector $P_1$ 402 adds 16 parity bits for a total of 80 bits in the outer codeword D, and the LDPC encoding process will add an additional 80 parity bits $P_2$ to the outer codeword to form a 160 bit codeword 400.

Figure 5:
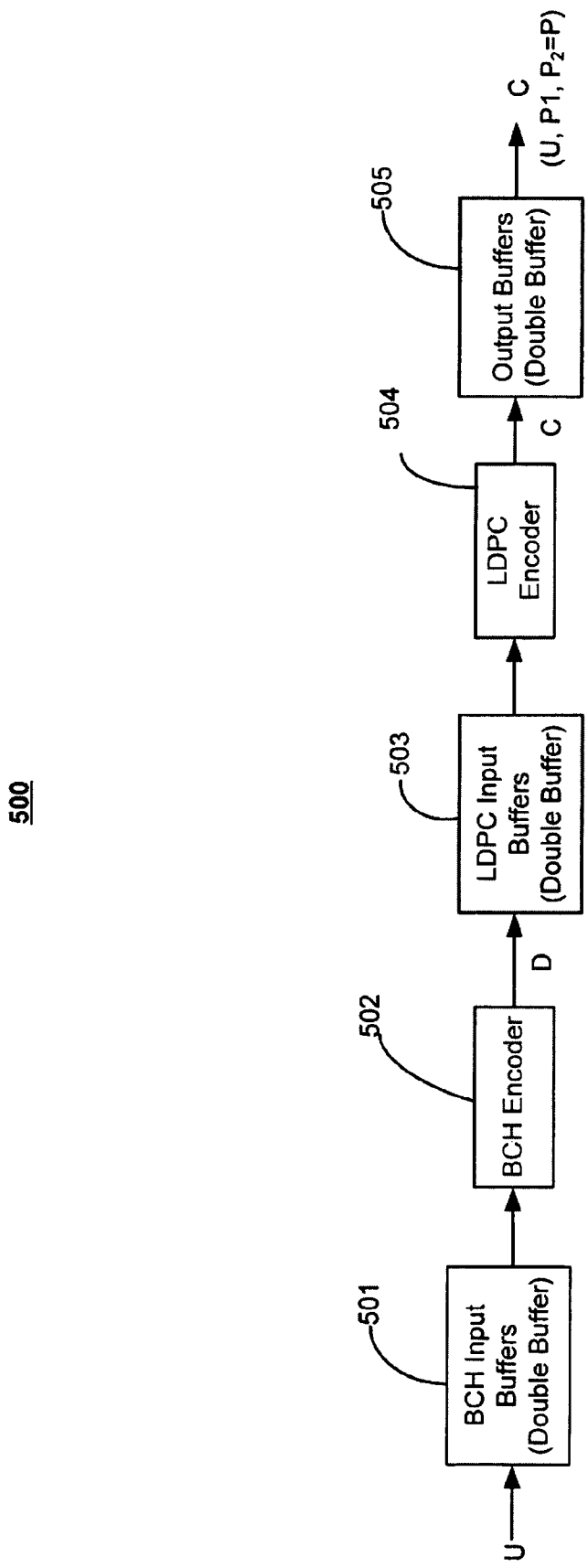
FIG. 5 is a simplified block diagram of a typical implementation of a concatenated LDPC-BCH code encoder.

FIG. 5 shows a simplified block diagram of BCH-LDPC encoder 500, which can represent one way to implement encoder 104 of FIG. 1. The resulting codeword can be based on an inner LDPC code and an outer systematic BCH code. The encoder 104 of FIG. 1 may be implemented in this manner in the data communication or storage system of FIG. 1, and the operation of LDPC encoder 504 may be mathematically represented by EQS 1-4 and EQS. 6-8 and the equations shown in FIG. 2. In addition to LDPC encoder 504 and BCH encoder 502, the BCH-LDPC encoder 500 may include BCH input memory buffer 501, LDPC input memory buffer 503, and output memory buffer 505. In some embodiments, the LDPC encoder 504 encodes an irregular quasi-cyclic codeword.

During typical operation of BCH-LDPC encoder 500, a message vector U is input into memory buffer 501. BCH encoder 502 may then append the BCH segment $P_1$ of the codeword to the message vector U. Once this process is complete, the message vector U with the BCH parity vector $P_1$ passes into LDPC encoder 504 via LDPC input memory buffer 503. LDPC encoder 504 outputs the LDPC-BCH codeword C into the output memory buffer 505.

Memory buffers 501, 503 and 505 may be of different sizes. For example, for codeword 400 in FIG. 4, input memory buffer 501 may store input message block U which may be 64 bits long, intermediate memory buffer 503 may store the outer codeword D which may be 80 bits long, while output memory buffer 505 may store codeword C which is 160 bits long. Thus, in BCH-LDPC encoder 500, BCH input memory buffer 501 may have up to two times the data storage capacity of the length of an input message block, intermediate memory buffer 503 may have up to two times the data storage capacity of the length of an input message block, and output memory buffer 505 may have up to four times the data storage capacity of the length of the input message block. Thus, the total memory requirement of LDPC encoder 600 may be up to eight times the size of an input message.

BCH-LDPC encoder 500 performs BCH encoding and LDPC encoding in a serial manner. Thus, the latency of BCH-LDPC encoder 500 may be up to at least three codewords. One of the reasons for this is the lack of parallelization of the encoding process, i.e., the inner BCH encoding is completed prior to starting the outer LDPC encoding. This may be necessary in LDPC encoding implementations that need the result of the outer codeword in order to operate. Also, as described above, the memory requirement of BCH-LDPC encoder 500 may be up to eight times the size of an input message. For systems where high encoding speeds and low memory requirement are desirable, it may be advantageous to implement a BCH-LDPC encoder (e.g., encoder 104 of FIG. 1) using a technique capable of providing a smaller latency and memory requirement than that of BCH-LDPC encoder 500.

Figure 8:
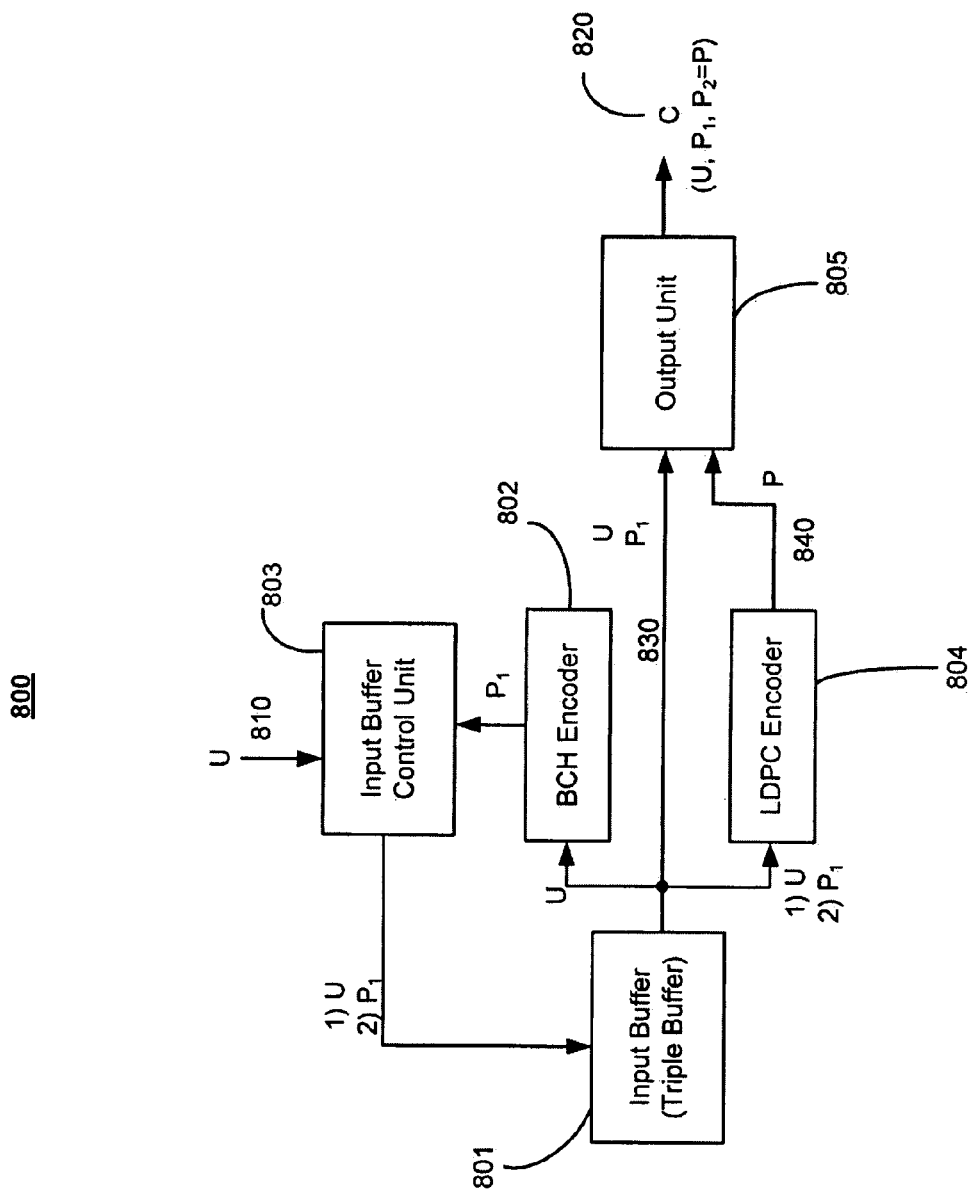
FIG. 8 is a simplified block diagram of an exemplary implementation of programmable LDPC encoder in a parallel combination with a BCH encoder.
Figure 9:
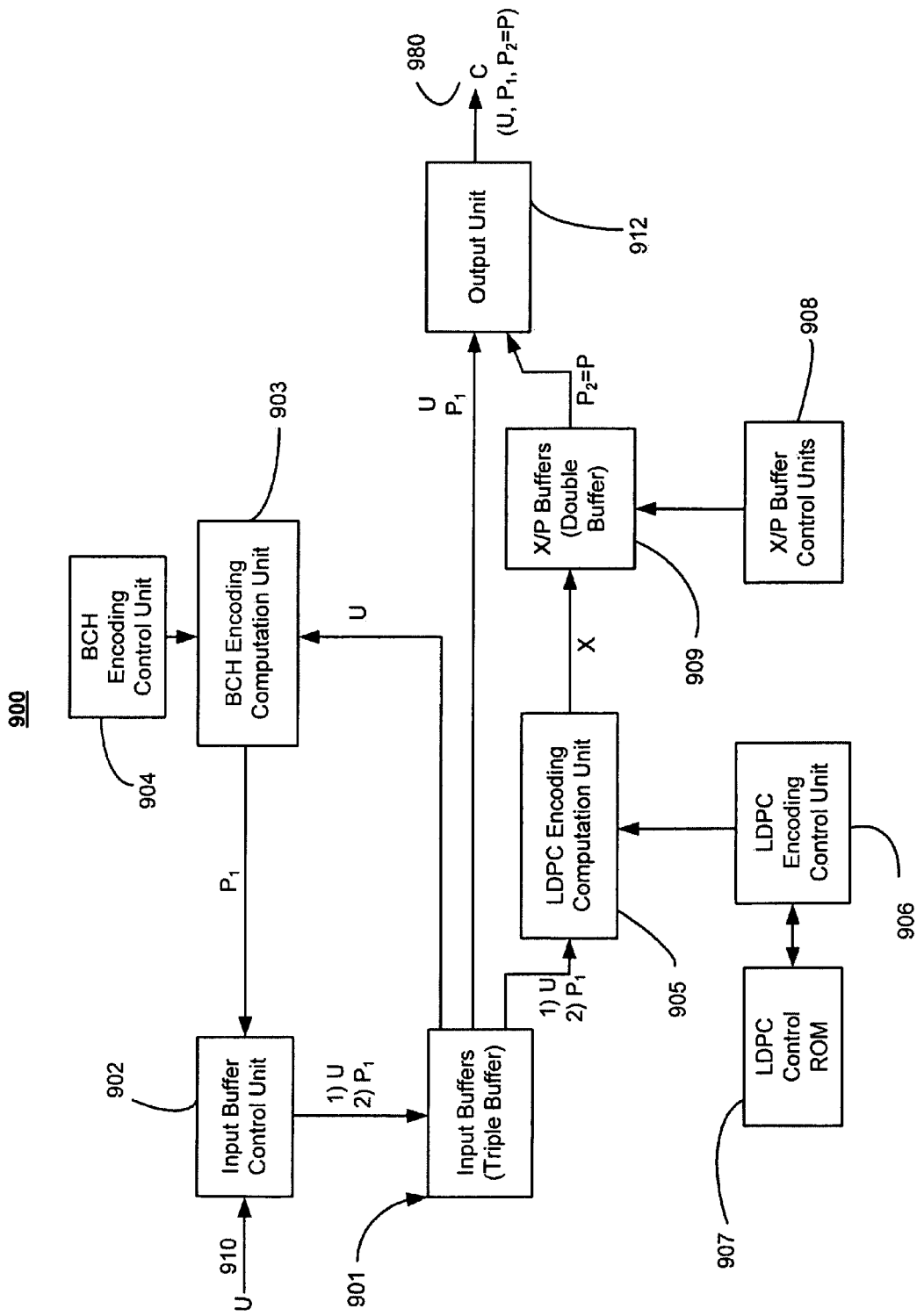
FIG. 9 is a more detailed, yet still simplified, block diagram of an exemplary implementation of a programmable LDPC encoder in a parallel combination with a BCH encoder.

Accordingly, embodiments of the present invention provide approaches to encoding data based on an inner LDPC code and an outer systematic code that have lower latency and memory requirements. In particular, FIGS. 6 and 7 show block diagrams of LDPC encoders that are operable to encode an input message concurrently with an outer encoder (e.g., systematic encoder 105 of FIG. 1), and FIGS. 8 and 9 show block diagrams of low-latency compact BCH-LDPC encoders having an LDPC encoder capable of operating concurrently with an outer encoder (e.g., BCH encoder 105 of FIG. 1).

Figure 6:
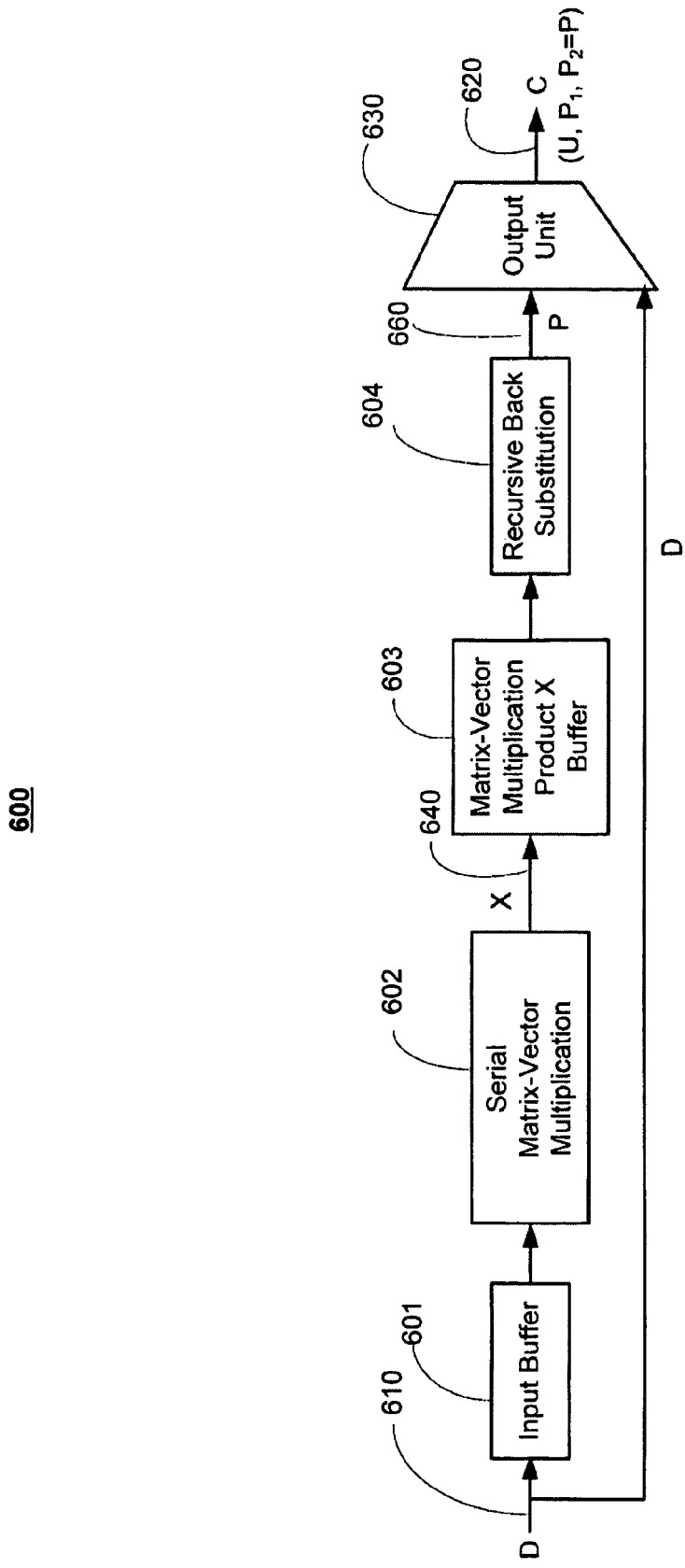
FIG. 6 is a simplified block diagram of a low-density parity check encoder.
Figure 7:
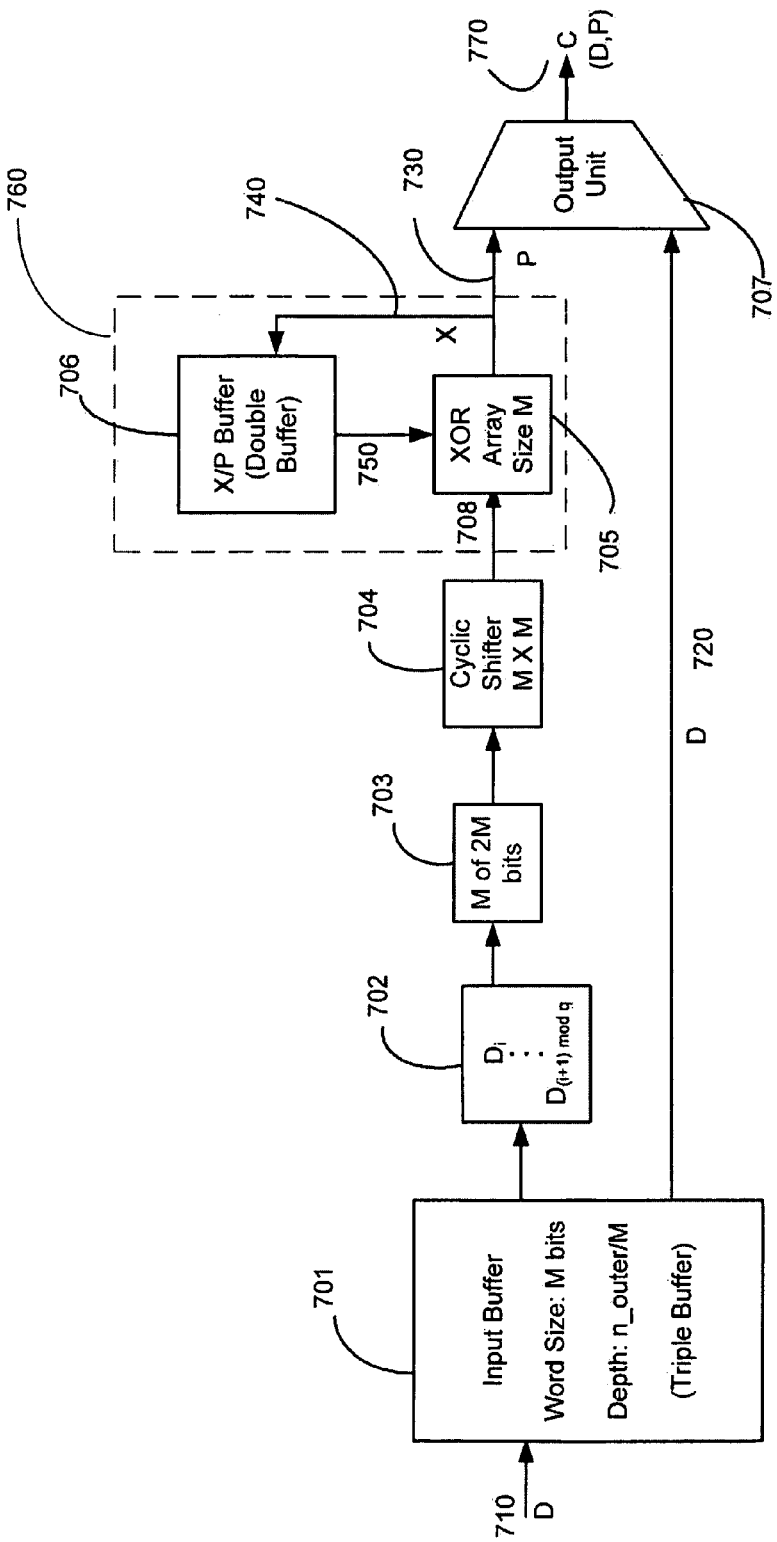
FIG. 7 is a more detailed, yet still simplified, block diagram of a low-density parity check encoder.

The LDPC encoders illustrated in FIGS. 6 and 7 can be implemented on a wide array of computational logic circuitry. In some embodiments, these LDPC encoders may be implemented on a field programmable gate array (FPGA). In these embodiments, any bit processing elements shown in the figures may include computational logic gates, such as AND, OR, XOR, NOT, or more complicated computational logic gates. Memory in these embodiments, such as memory buffers, may include flip-flop circuitry, or more complete blocks of memories such as static random access memory (SRAM) or erasable programmable read-only memory (EPROM).

In certain other embodiments, the LDPC encoders of FIGS. 6 and 7 may be implemented as an application-specific integrated circuit (ASIC). In these embodiments, the bit processing elements may include computational logic gates, such as AND, OR, XOR, NOT, or more complex bit-processing elements such as microprocessors. Memory in these embodiments may include read-only memory (ROM), random access memory (RAM), or any other suitable memory. The number of bit processing elements and the amount of memory in the LDPC encoder may be determined based on the desired throughput of the LDPC encoder.

These implementation approaches are merely illustrative. The LDPC encoders of FIGS. 6 and 7 and described components may be implemented instead based on any suitable hardware, firmware, and/or software approach.

FIG. 6 shows a simplified block diagram of a low-density parity check (LDPC) encoder 600 that may be a more detailed representation of the inner LDPC encoder 107 in FIG. 1. In one implementation, LDPC encoder 600 includes input memory buffer 601 for storing outer codeword 610, serial block matrix-vector multiplication module 602, block matrix-vector multiplication result (i.e., the vector X in EQ. 5 or FIG. 2) buffer 603, recursive back substitution module 604, and output unit 630. LDPC encoder 600 may be used to produce low-density parity check codeword 620 based on an LDPC code that may be regular or irregular. For clarity in describing embodiments of the present invention, an outer codeword, such as output codeword 610, that is provided to an LDPC encoder, such as LDPC encoder 600, may sometimes be referred to as an input vector or input vector D.

In some embodiments, LDPC encoder 600 may be used to produce an quasi-cyclic low-density parity check (QC-LDPC) codeword, such as codeword 400 in FIG. 4, or any other suitable codeword based on an inner LDPC code with an outer systematic code, e.g., a BCH code. To perform this encoding, recall that the parity check matrix H for the QC-LDPC code employed by LDPC encoder 600 can be partitioned into a data portion A and a parity portion B as shown in EQ. 3 or FIG. 2. Similarly, the codeword 620 can be partitioned into a data segment (which in this case includes a message vector and an outer code parity vector, $P_1$) and an LDPC parity segment, $P_2$, as shown in EQ. 4 or FIG. 2.

LDPC encoder 600 processes input vector 610 and computes both X (labeled 640 in FIG. 6) and P (labeled 660 in FIG. 6. The variables X and P are then used to compute codeword C (labeled 620 in FIG. 7). During operation of LDPC encoder 600, input vector 610 may be stored in input memory buffer 601. Serial block matrix-vector multiplication module 602 may then retrieve input vector 610 from memory buffer 601, and multiply input vector 610 by the data portion of the parity check matrix (e.g., the A matrix in FIG. 2 or EQ. 6), to obtain matrix-vector product X (640). Serial block matrix-vector multiplication module 602 effectively carries out the computation encompassed in EQ. 6.

Rather than computing the matrix-vector multiplication with the entire A matrix in parallel, the multiplication may be broken up into two phases. The first phase may be associated with the message portion of the A matrix, such as with message portion 404 of FIG. 4. In this first stage, serial block matrix-vector multiplication module 602 may perform a matrix-vector multiplication between the message portion of the A matrix with the message segment U of input vector 610.

The second phase of the A matrix matrix-vector multiplication may be associated with the outer code parity portion of the A matrix, and may involve performing a matrix-vector multiplication between the outer code parity portion with the outer code parity segment $P_1$ of input vector 610. The matrix-vector products produced by each phase, which may each be referred to as partial products, can be combined into a single, complete matrix-vector product of the A matrix with input vector 610 (D).

Note that the first phase of the matrix-vector multiplication does not require the value of the outer code parity segment of input vector D. Thus, serial block matrix-vector multiplication module 602 may begin operating in the first phase before the values of the outer code parity bits are known. This approach advantageously allows inner LDPC encoder 600 to operate in parallel with an outer code encoder, i.e., a BCH encoder.

Serial block matrix-vector multiplication module 602 may further break down each of the two phases into smaller computations that are performed in serial stages. In particular, serial block matrix-vector multiplication module 602 may process each circulant of the A matrix separately, regardless of whether the circulant is in the message portion or the outer code parity portion of the A matrix, and can proceed either row-by-row or column-by-column in the appropriate portion of the A matrix.

Using parity check matrix 410 and row-by-row processing as an example, serial block matrix-vector multiplication module 602 may first work with the message portion of the matrix 410, and can multiply a first block of input vector 610 (e.g., the first 16 bits for Z=16) by the upper-left 11-valued circulant. Serial block matrix-vector multiplication module 602 may then proceed to multiply that same block by −1, 8, and 13 (e.g., the remaining blocks in the first row of message portion 404), before moving to the next row of parity check matrix 410 and a second block of input vector 610 (e.g., the second 16 bits). Once the rows of the message portion have been processed, multiplication module 602 may apply the same row-by-row approach to outer parity portion 405 of parity check matrix 410. For each row of the A matrix, a block of the X vector (e.g., a 16-bit block referred to as $X_0$) can be produced by adding, modulo-2, the result of the multiplications for that same row. The blocks of matrix-vector product X (640) may then be stored in buffer 603.

From matrix-vector product 640, parity vector 660 may be computed by the recursive back substitution module 604. Recursive back substitution module 604 may carry out the computation encompassed in EQS. 7 and 8. That is, recursive back substitution module 604 may multiply the matrix-vector product X by the inverse of the parity portion B in the parity check matrix. Because X is an intermediate value used to compute the parity vector 660, X may sometimes be referred to as an intermediate vector. Recursive back substitution module 604 may compute parity vector 660 from the intermediate vector in two stages using a back-substitution procedure. First, recursive back substitution module 604 may operate in a first mode to add the blocks of matrix-vector product X together. This summation computation may be referred to as a sumX computation, for simplicity, and the resulting sum may be used to in a back substitution computation. The sumX operation and the back substitution operation together produce the size-Z blocks of parity vector 660 in a serial manner. These two modes will be described in greater detail below in connection with FIG. 7. In one implementation, output unit 630 computes codeword 620 by combining parity vector 660 produced by recursive back substitution module 604 and input vector 610.

In some embodiments, recursive back substitution module 604 of LDPC encoder 600 uses one or more XOR gate arrays for computation of sumX and the back substitution procedure. Only one such XOR gate array of size Z may be needed if one entry in parity vector 660 is computed in one clock cycle of the FPGA or ASIC. Additionally, in some embodiments, the speed of encoding may be increased by using two or more size Z XOR gate arrays, since some of the recursive operations may be performed in parallel. In this case, two or more parity vector blocks may be computed in one clock cycle of the FPGA or ASIC. Such an implementation speeds up the encoding of the QC-LDPC codeword 620.

Note that the matrix-vector multiplication to serially obtain X and the sumX accumulation of the entries in X can operate based on size-Z blocks and size-ZxZ circulants. That is, after each serial stage, serial block matrix-vector multiplication module 602 can produce an entry of the X matrix. Therefore, serial block matrix-vector multiplication module 602 does not need to compute the entire X vector in order for recursive back substitution module 604 to begin computing sumX.

Recursive back substitution module 604 may instead accumulate the blocks of X as they are being computed by serial block matrix-vector multiplication module 602. That is, recursive back substitution module 604 can update the accumulated sum after each block of X is computed. This and other features can be more readily appreciated by the block diagram shown in FIG. 7.

FIG. 7 shows an exemplary embodiment of block serial LDPC encoder 700, which may be a detailed representation of LDPC encoder 600 in FIG. 6, and/or a detailed representation of encoder 104 in FIG. 1. In some embodiments, block serial LDPC encoder 700 may operate according to a quasi-cyclic low-density parity check (QC-LDPC) code, such as the LDPC code having parity check matrix 410 of FIG. 4, or any other suitable concatenated code based on an inner LDPC code and an outer systematic code. In one implementation, block serial LDPC encoder 700 includes input memory buffer 701, block selector 702, data selector 703, cyclic block shifter 704, XOR gate array 705, X/P memory buffer 706, and output unit 707.

Each of the components of block serial LDPC encoder 700 may process M bits in parallel, where M is divisible by the length of inner codeword 710 and is usually a positive integer power of 2 (e.g., $M=2^m$ where m is a positive integer). The value of M may sometimes be referred to as the parallelism of M. For example, if block serial LDPC encoder 700 is associated with a parity check matrix made up of circulants of size Z=16 (e.g., parity check matrix 410 of FIG. 4), block serial LDPC encoder 700 may have a parallelism of eight or a parallelism of four.

During operation of block serial LDPC encoder 700, input vector 710 may be first stored in input memory buffer 701. In this exemplary embodiment, the word size of input memory buffer 701 may be M (the parallelism) and the depth may be given by $n_{outer}$/M. In certain embodiments, the input memory buffer 701 has two or three times the data storage capacity of the size of input vector 710. This triple buffering allows the encoder to accommodate the additional memory resources needed due to the requirements of the write channel on some implementations memory buffer 701. However, the size of input memory buffer 701 can be decreased to one or two times the size of input vector 710 for other buffer implementations that have lesser write channel requirements.

Block selector 702, data selector 703, and cyclic block shifter 704 may perform part of the vector-matrix multiplication described above in connection with serial matrix-vector multiplication module 602 of FIG. 6. At any given time during operation, these components can multiply a size Z block of input vector 710 with one circulant of the parity check matrix, but in sub-blocks of M input bits and M×M portions of the parity check matrix. For example, if the circulant size is Z=16 and M=8, components 702, 703, and 704 can perform two separate multiplications to obtain the matrix-vector product for eight rows of the 16×16 circulant. These components can multiply an 8-bit segment of the block with a first 8×8 portion of the circulant and can multiply the 8-bit segment with a second 8×8 portion of the circulant that is in the same row of the parity check matrix. The two results may be added to obtain the matrix-vector multiplication for the first M rows of that circulant. By dividing each circulant into sub-matrices, block serial LDPC encoder 700 is not restricted to a parallelization equal to the circulant size, and can instead be configured to have any desired parallelization. The parallelization may, for instance, be selected based on the desired speed and hardware area of block serial LDPC encoder 700.

In one implementation, block serial LDPC encoder 700 includes block selector 702 and data selector 703 to identify which of the M×M blocks of a parity check matrix that cyclic block shifter 704 should currently be operating with. Block selector 702 may identify the appropriate circulant based on, for example, the previous circulant that was processed and whether the message or the outer code parity portions of the parity check matrix are being processed. Based on the current circulant, block selector 702 may identify Z bits of input vector 710 that correspond to the current circulant of the parity check matrix. For instance, if input vector 710 is 80 bits and Z=16, block selector 702 may keep track of which of the five 16-bit blocks should be multiplied by the current circulant, and can provide the appropriate block of bits to data selector 703.

From the block of Z bits identified by block selector 702, data selector 703 may identify a current segment of M bits (e.g., 8 bits) in the block to pass to cyclic block shifter 704. Cyclic block shifter 704 may then multiply the supplied M bits of input vector 710 with the M×M portion of the current circulant to produce a partial matrix-vector product for a portion of a block X.

Thus, (in one implementation) block selector 702, data selector 703, and cyclic block shifter 704 may be configured to compute the matrix-vector product of a circulant in multiple cycles. The matrix-vector product for one circulant may sometimes be referred to as a fractional matrix-vector product, because this product is only part of the calculation to produce a block of matrix-vector product X. As described above, block selector 702, data selector 703, and cyclic block shifter 704 may be configured to complete the fractional matrix-vector product for a circulant (e.g., the top-left circulant with value 11 in FIG. 4) before processing another circulant. Thus, block selector 702 may not move to the next block of input vector 710 until data selector 703 has iterated through all of the M-bit segments in the block, and cyclic block shifter 704 has iterated through all of the M×M portions of the current circulant. In an exemplary embodiment, these components may be configured such that the circulants of the parity check matrix are cycled through row-by-row, where the processing for a circulant is completed by cycling through the M×M sub-matrices for that circulant row-by-row.

In one implementation, block serial LDPC encoder 700 is not restricted to cycling through the circulants of the parity check matrix in any particular order, and therefore block selector 702, data selector 703, and cyclic block shifter 704 may be configured to iterate through the circulants in the message portion of the parity check matrix (e.g., portion 404 in FIG. 4) prior to cycling through the circulants of the outer code parity portion (e.g., portion 405 of FIG. 4). This property advantageously allows block serial LDPC encoder 700 to operate initially without knowledge of the parity bits generated by the outer systematic code, e.g., BCH code.

The current segment of X, or $X_i$ 708, may be input to logic block 760. In one implementation, logic block 760 includes size M XOR array 705. XOR array 705 can include an array of logic components configured to perform exclusive-or (XOR) bit operations. XOR array 705 can complete the matrix-vector multiplication started by cyclic block shifter 704, perform the sumX computation to serially accumulate the entries of vector X, and perform the recursive back-substitution computations to serially compute the blocks of parity vector P.

In one implementation, cyclic block shifter 704 provides fractional matrix-vector products for a current row or column in different clock cycles. Thus, if block serial LDPC encoder 700 operates on the circulants row-by-row, logic block 760 may receive all of the fractional matrix-vector products for a given row of the data portion A in multiple clock cycles. Note that the cycles may not be consecutive, because the rows of the message portion of a parity check matrix and the rows of the outer code parity portion of the parity matrix are operated on separately. For example, referring briefly back to FIG. 4, cyclic block shifter 704 may provide fractional matrix-vector products for the first row of matrix 410 in a first group (based on entries 11, −1, 8 and 13) and a second group (e.g., the product based on entry 12) sometime later than the first group. Logic block 760 may be configured as an accumulator to accumulate the sum of these fractional products. In particular, logic block 760 can include X/P memory buffer 706 for storing an accumulated value (e.g., the sum of previous fractional matrix-vector products) and XOR array 705 for updating the accumulated value with a newly received value (e.g., the fractional product for the current circulant) to the stored accumulated value.

Thus, logic block 760 may be operable to accumulate the fractional products as they are provided from cyclic block shifter 704. For example, the sum of the fractional products for a row computed thus far may be stored in X/P memory buffer 706. When a new fractional product for the same row of the data portion A is received, XOR array 705 may be configured to add the previous sum 750 obtained from X/P memory buffer 706 to the newly received fractional product to obtain an updated sum 740. The updated sum of fractional matrix-vector products may be stored back into X/P memory buffer 706 by overwriting the previous sum. In this way, logic block 760 can act as an accumulator with an update mechanism that allows X/P memory buffer 706 to compute a block of X.

Because of this serial update mechanism, logic block 760 is fully customizable to any number of non-zero circulants in each row. That is, because the update mechanism involves only a modulo-2 addition of a stored value and a new value, the implementation of logic block 760 does not depend on the number of fractional matrix-vector products included in the summation. Therefore, block serial LDPC encoder 700 has the advantageous property of being capable of operating based on irregular codes regardless of the difference in weight between the rows or columns of the parity check matrix. In addition, block serial LDPC encoder 700 has the advantageous property of being programmable for any suitable code profile, block length, or any other code characteristic.

While modules 702, 703, and 760 compute the blocks of the matrix-vector product X, logic block 760 may additionally compute the sum of all of the X matrix-vector products, or sumX, in parallel. In order to have the resources to complete these operations concurrently, XOR array M may include 2M XOR components—M for computing X and another M for computing sumX. X/P memory buffer 706 may include storage space to store both of these values. The sum of the X matrix-vector products may be used to recursively compute the LDPC parity vector 730, as described herein using the parity check matrix specified in the IEEE 802.11n standard as an example. The contents of the IEEE 802.11n standard is hereby incorporated by reference herein in its entirety.

In some embodiments, the parity check matrix used by block serial LDPC encoder 700 may correspond to the parity check matrix specified in the 802.11n standard. In these embodiments, the parity portion B of the parity check matrix used by recursive back substitution module 604 is a dual diagonal block matrix. Given matrix-vector product X and parity portion B of the parity check matrix H, the entries of parity vector P may be computed by recursive back substitution module 604 using EQ. 9:

$$\begin{bmatrix} I^c & I & & & & & & & \\ & I & I & & & & & & \\ & & I & I & & & & & \\ & & & \ddots & \ddots & & & & \\ & & & & I & I & & & \\ I^d & & & & & I & I & & \\ & & & & & & I & I & \\ & & & & & & & \ddots & \ddots \\ & & & & & & & & I & I \\ I^c & & & & & & & & & I \end{bmatrix}_B \begin{bmatrix} p_0 \\ p_1 \\ p_2 \\ \vdots \\ p_{j-2} \\ p_{j-1} \\ p_j \\ \vdots \\ p_{q-2} \\ p_{q-1} \end{bmatrix}_P = \begin{bmatrix} x_0 \\ x_1 \\ x_2 \\ \vdots \\ x_{j-2} \\ x_{j-1} \\ x_j \\ \vdots \\ x_{q-2} \\ x_{q-1} \end{bmatrix}_X \quad \text{(EQ. 9)}$$

Note that I denotes a block identity matrix, $I^c$ denotes a cyclic shift of c rows or columns of the identity matrix I, and $I^d$ denotes a cyclic shift of d rows or columns of the identity matrix I. Parity vector P includes entries $p_0, p_1, \ldots, p_{q-1}$, whereas the X vector includes entries $x_0, x_1, \ldots, x_{q-1}$. The non-negative integer indices i, j, and q are reference symbols for the entries of vectors X and/or P, where q refers to the number of blocks in the parity vector 730 and may be given by, $n_{outer}/Z$.

Matrix-vector EQ. 9 can be rewritten as the following series of equations:

$$p_0^c + p_1 = x_0 \quad \text{(EQ. 10)}$$

$$p_i + p_{i+1} = x_i, i \neq 0, i \neq q-1, i \neq j-1 \quad \text{(EQ. 11)}$$

$$p_0^d + p_{j-1} + p_j = x_{j-1} \quad \text{(EQ. 12)}$$

$$p_0^c + p_{n-1} = x_{q-1} \quad \text{(EQ. 13)}$$

from which it is clear the dual diagonal structure of matrix B has been exploited. That is, it is clear that the structure of matrix B results in EQS. 10-13, which can be solved recursively by, for example, logic block 760 using the serial update mechanism or recursive back substitution module 604 of FIG. 6. Note that EQ. 11 may be valid for many values of index i, except for the three values indicated. EQS. 10-13 can be added to obtain the following expression for obtaining one of the blocks, $p_0^d$, of the parity vector P:

$$p_0^d = \sum_{i=0}^{i=n=q-1} x_i \quad \text{(EQ. 14)}$$

Since the cyclic shifts c and d are known, the first entry of the parity vector (e.g., parity vector 660), $p_0$ can easily be obtained from $p_0^d$. The value of $p_0^c$ may be obtained easily as well. EQ. 14 illustrates the sumX computation performed by logic block 760. Therefore, the sumX computation can be thought of as part of the calculation to obtain parity vector X. Because EQ. 14 can be computed in parallel with the summations to compute blocks of P, in these embodiments, logic block 760 is effectively able to compute the entries of the X vector and the entries of the P vector in parallel. This can advantageously allow block serial LDPC encoder 700 to have a reduced encoding latency, and is part of the reason that the latency can be reduced to, for example, one codeword.

Once logic block 760 has computed all of the entries of matrix-vector product X and logic block 760 has obtained the first entry of parity vector P from EQ. 14, logic block 760 may compute the remaining blocks of parity vector P. That is, the other blocks in the recursively by logic block 760. For example, logic block 760 may use the update mechanism described above, and can utilize the recursive accumulation equations of EQ. 13 and EQ. 14 to compute $p_1$ using $p_0$, then $p_2$ using $p_1$ and $p_0$, etc., until all the blocks of parity vector P have been computed.

In one embodiment, $p_1$ and $p_{q-1}$ are computed by logic block 760 or recursive back substitution module 604 (FIG. 6) first using $p_0^c$ and either $x_0$ (in EQ. 10) or $x_{q-1}$ (in EQ. 13), respectively. The rest of the entries of the parity vector P are then computed by logic block 760 or recursive back substitution module 604 using the above-described update mechanism and the recursion equations EQ. 15 and EQ 16:

$$p_i = p_{i-1} + x_{i-1}, 2 \leq i \leq j-1 \quad \text{(EQ. 15)}$$

$$p_i = p_{i+1} x_i, j \leq i \leq q-2 \quad \text{(EQ. 16)}$$

In this embodiment, the computations of the respective parity vector entries in EQS. 15 and 16 may be performed in parallel by recursive back substitution module 604. For instance, $p_2$ and $p_{n-2}$ may be computed at the same time and then $p_3$ and $p_{n-3}$ may be computed at the same time. Such computation allows for a block-level parallelization of the recursive back-substitution process within logic block 760 or recursive back substitution module 604, which reduces the required number of computation cycles for the parity vector P by at least one half of the required number if block-level parallelization was not used. To implement this parallelization, logic block 760 (for example) may use M XOR components of XOR array 705 and M other XOR components of XOR array 705 to compute EQ. 15 and EQ. 16, respectively.

In some embodiments, the recursive back substitution module 604 may compute the respective parity vector blocks or entries in EQS. 15 and 16 in parallel. In one embodiment, one parity vector entry or block in the parity vector P may be computed in one clock cycle of the FPGA or ASIC. Note that the size of each parity vector block or entry may be equal to the size of the circulant Z, because block serial LDPC encoder 700 is configured to operate on each circulant individually. In other embodiments, a number l parity vector entries or blocks may be computed in one clock cycle of the FPGA or ASIC. That is, multiple recursions of EQ. 15 and/or EQ. 16 may be carried out in a single clock cycle. However, if this parallelization is carried out, the length of the clock cycle may increase by, for example, a factor of $$\frac{1}{l}.$$

In another embodiment, logic block 760 can implement a different accumulation process to compute the entries of the parity vector P. First, $p_1$ may be computed by recursive back substitution module 604 using $p_0^c$ and $x_0$ (in EQ. 10). The rest of the entries of the parity vector P are then computed by logic block 760 or recursive back substitution module 604 using the recursion equations EQ. 17 and EQ 18:

$$p_i = p_{i-1} + x_{i-1}, 2 \leq i \leq j \quad \text{(EQ. 17)}$$

$$p_j = p_0 + p_{j-1} + x_{j-1} \quad \text{(EQ. 18)}$$

Overall, using the update mechanism and the recursion equations derived from EQS. 10-13, in some embodiments, entries of the parity vector P and entries of the matrix-vector product X may be computed in parallel by recursive back substitution module 604 (FIG. 6) and matrix multiplication module 602 (FIG. 6), respectively, or by logic block 760. In this manner, $x_0, x_1, \ldots x_{n-1}$, are computed serially by processing the circulants of the parity check matrix in a row-by-row fashion. As entries $x_0, x_1$, etc., are computed by matrix multiplication module 602 or logic block 760, entry $p_0^d$ of parity vector P may be computed by recursive back substitution module 604 or logic block 760 in stages using EQ. 14.

Output unit 707 produces codeword 770 by processing the outputs produced by logic block 760, i.e., P, and, the outer systematic codeword 720, i.e., D (given by U and $P_1$). In certain embodiments, outer systematic codeword is a BCH or RS codeword, similar to those contained in segments 401 and 402 of codeword 400 in FIG. 4.

Assuming the number of circulants in the data portion A of the parity check matrix H to be $N_{cd}$, the size of the circulant to be Z, the number of block rows in matrix H to be $N_b$, and the size of the XOR array to be M, the number of cycles required for encoding, referred to by the symbol $N_e$, may be given by:

$$N_e = \left\lceil \frac{Z}{M} \right\rceil (N_{cd} + N_b) \quad \text{(EQ. 19)}$$

where $\lceil x \rceil$ denotes the mathematical operation of computing the ceiling of x, i.e., the closest integer that is greater than or equal to x. Note that M may be referred to as the level of encoder parallelization.

FIG. 8 is a simplified block diagram of a BCH-LDPC encoder 800 which can be a more detailed representation of encoder 104 in FIG. 1. BCH-LDPC encoder 800 can illustrate an embodiment of an encoder for a BCH-LDPC concatenated code that can utilize the advantageous properties of LDPC encoder 600 of FIG. 6 and block serial LDPC encoder 700 of FIG. 7. Thus, in some embodiments, LDPC encoder 804 can have any of the features or functionalities of block serial LDPC encoder 700 in FIG. 7, or LDPC encoder 600 in FIG. 6. BCH-LDPC encoder 800 includes programmable LDPC encoder 804 in a parallel combination with BCH encoder 802, which may also be programmable. BCH-LDPC encoder 800 can also include input memory buffer 801, input memory buffer control unit 803, and output unit 805. In certain embodiments, input memory buffer 801 has three times the data storage capacity of the length of the input message vector, U.

During typical operation, a message vector U (810) may be input into input memory buffer control unit 803. Input memory buffer control unit 803 may then store message vector 810 into input memory buffer 801. BCH encoder 802 computes the BCH parity segment of codeword 820 based on message vector 810 obtained from input memory buffer 801. This parity segment may then be stored in input memory buffer 801, which may be controlled by input memory buffer control unit 803. Input memory buffer 801 may then contain all of the information of a BCH outer codeword, i.e., U and $P_1$. In some embodiments, the computation of the BCH parity segment of codeword 820 proceeds in parallel to the computation of the LDPC parity portion of codeword 820—i.e., BCH encoder 802 and LDPC encoder 804 can operate in parallel. BCH encoder 802 and LDPC encoder 804 can both read from input memory buffer 801 to obtain the value of message vector 810, and can both generate their respective parity vectors from message vector 810 simultaneously.

BCH encoder 802 and LDPC encoder 804 are capable of operating on the input message vector 810 independently. As previously described, one of the reasons for this capability is that BCH encoder 802 is a systematic code encoder, and therefore BCH encoder 802 produces a BCH outer codeword that includes message vector 810. In particular, BCH encoder 802 can generate a BCH parity vector and can concatenate the BCH parity vector to message vector 810. Because part of the outer codeword provided to LDPC encoder 804 includes the message vector 810, LDPC encoder 804 does not need to wait for BCH encoder 802 to produce the outer codeword before starting operation, and can instead begin immediately to encode message vector 810 stored in input memory buffer 801.

LDPC encoder 804 can operate on the outer codeword vector D. LDPC encoder 804 may generate the LDPC code bits using EQ. 6 (AD=X). For example, assuming a parity check matrix 410 in FIG. 4, portion 404 may be the message portion of the matrix 410, while portion 405 may be the BCH parity portion of the matrix 410. Portion 404 may constitute matrix A as described in EQ. 6. Thus, portion 404 could be used by LDPC encoder 804 to partially generate the LDPC parity bits $P_2 = P$ from message vector 810 stored in input memory buffer 801. Once the BCH encoder 802 has produced the BCH parity bits $P_1$ and the BCH parity bits are stored in input memory buffer 801, LDPC encoder 804 may finish computing the LDPC parity bits P using portion 405 (matrix B in EQ. 6) of the parity check matrix. That is, LDPC encoder 804 may continue to read from input memory buffer 801 to obtain the value of the BCH parity bits, and can finish computing P based on these BCH parity bits.

In one implementation, output unit 805 produces codeword 820 by concatenating the message vector U and the BCH parity portion $P_1$ as obtained from input memory buffer 801, with the LDPC parity portion $P_2$=P, which are all parts of the codeword 820. In this exemplary embodiment, the implementation may include computational units typically found in FPGAs or ASICs.

FIG. 9 is a block diagram of a BCH-LDPC encoder 900, which may be a detailed representation of the BCH-LDPC encoder 800 of FIG. 8. BCH-LDPC encoder 900 can include a programmable inner LDPC encoder (embodied at least partially by LDPC encoding computation unit 905) in a parallel combination with an outer BCH encoder (embodied at least partially by BCH encoding computation unit 903). BCH-LDPC encoder 900 can also include input memory buffer 901, input memory buffer control unit 902, BCH encoding control unit 904, LDPC encoding control unit 906, LDPC control read-only memory (ROM) 907, X/P memory buffer 909, X/P memory buffer control unit 908, and output unit 912. The codeword produced by BCH-LDPC encoder 900 may be an LDPC codeword based on an outer systematic BCH code, similar to codeword 400 of FIG. 4.

In some embodiments, LDPC encoding computation unit 905 may have the features and functionalities of LDPC encoder 600 in FIG. 6. In certain embodiments, input memory buffer 901 has three times the data storage capacity of the length of the input message block, M.

During typical operation, message vector U (910) may be input into input memory buffer control unit 902. BCH encoding computation unit 903 computes the BCH parity portion of codeword 980. In one implementation, BCH encoding control unit 904 controls the operation of BCH encoding computation unit 903. BCH parity portion of codeword 980 may then be stored in input memory buffer 901, which may be controlled by input memory buffer control unit 902. In some embodiments, the computation of the BCH parity portion of codeword 980 proceeds in parallel to the computation of the LDPC portion of codeword 980

The LDPC encoding functionality of LDPC encoder 804 is embodied in BCH-LDPC encoder 900 by LDPC encoding computation unit 905, LDPC encoding control unit 906, LDPC control ROM 907, X/P buffer control units 908, and X/P memory buffers 909. Any of these components may correspond to the components of block serial LDPC encoder 700 of FIG. 7. For example, X/P memory buffers 909, which are controlled by X/P buffer control units 908, may have any of the features and functionalities of X/P memory buffer 706 of FIG. 7. Similarly, LDPC encoding computation unit 905 may have any of the features and functionalities of cyclic block shifter 704 and XOR array module 708. Thus LDPC encoding computation unit 905 can perform both the serial block matrix-vector multiplications required to produce the entries of vector X=AD and the recursive back-substitution computations to serially compute the entries of parity vector P. With the use of memory buffers 909, LDPC encoding computation unit 905 may proceed cyclically as in the block serial LDPC encoder 700 of FIG. 7 with one block of the X or the P vector computed in each processor clock cycle.

In one implementation, LDPC encoding control unit 906 communicates with LDPC Read-Only Memory (ROM) 907 to effectively control LDPC encoding control unit 906. In some embodiments, LDPC control ROM 907 may store the parity check matrix associated with the LDPC code. In some embodiments, in order to enable LDPC code programmability, LDPC control ROM 907 may store the parity check matrix for different LDPC codes (e.g., of different correction capabilities, different sizes, different irregularities, etc.), and LDPC encoding control unit 906 can select one of the parity check matrices to use in encoding a current outer codeword. Thus, LDPC encoding control unit 906 effectively controls, among other things, the LDPC code profile, code rate, parity check matrix block length, number of parity check matrix block rows, and number of parity check matrix block columns. As described above, because of the circulant representation of the parity check matrices, each of the parity check matrices stored in LDPC control ROM can be stored in a compact manner. Thus, the amount of storage space needed in LDPC control ROM 907 for storing parity check matrices may advantageously be small.

LDPC encoding control unit 906 may also control LDPC encoding computation unit 905 such that the appropriate circulant of a parity check matrix is being utilized at any given time. LDPC encoding control unit 906, for example, may control LDPC encoding computation unit 905 based on the size of the data portion A and the size of the BCH parity portion B of the LDPC code's parity check matrix. In these embodiments, LDPC encoding control unit 906 may embody the control functions described above in connection with block selector 702 and data selector 703 of FIG. 7.

BCH-LDPC encoder 900 can include only two memory buffers, as opposed to three in other BCH-LDPC encoder implementations, such as the serial BCH-LDPC encoder 500 in FIG. 5. The memory requirements for BCH-LDPC encoder 900 (as well as BCH-LDPC encoder 800 of FIG. 8 in some embodiments) are much smaller than those for BCH-LDPC encoder 500. In particular, the BCH-LDPC encoder 500 of FIG. 5 needs an additional memory buffer 503 to store the intermediate, outer codeword generated by BCH encoder 502, while BCH-LDPC encoder 800 or BCH-LDPC encoder 900 do not require a similar memory buffer. As described above in connection with BCH-LDPC encoder 500 of FIG. 5, the total storage capacity implemented for BCH input memory buffer 501, intermediate memory buffer 503, and output memory buffer 505 may be up to eight times the size of the input message block. On the other hand, in BCH-LDPC encoder 900, input memory buffer 901 may have up to three times the data storage capacity of the length of an input message block and output memory buffer 909 may have up to two times the data storage capacity of the length of an input message block. Thus, the total storage capacity of input memory buffer 901 and output memory 909 may be approximately five times the size of the input message block U. The memory requirements of the parallel BCH-LDPC encoder 900, therefore, may be nearly half that of the serial BCH-LDPC encoder 500.

Figure 10:
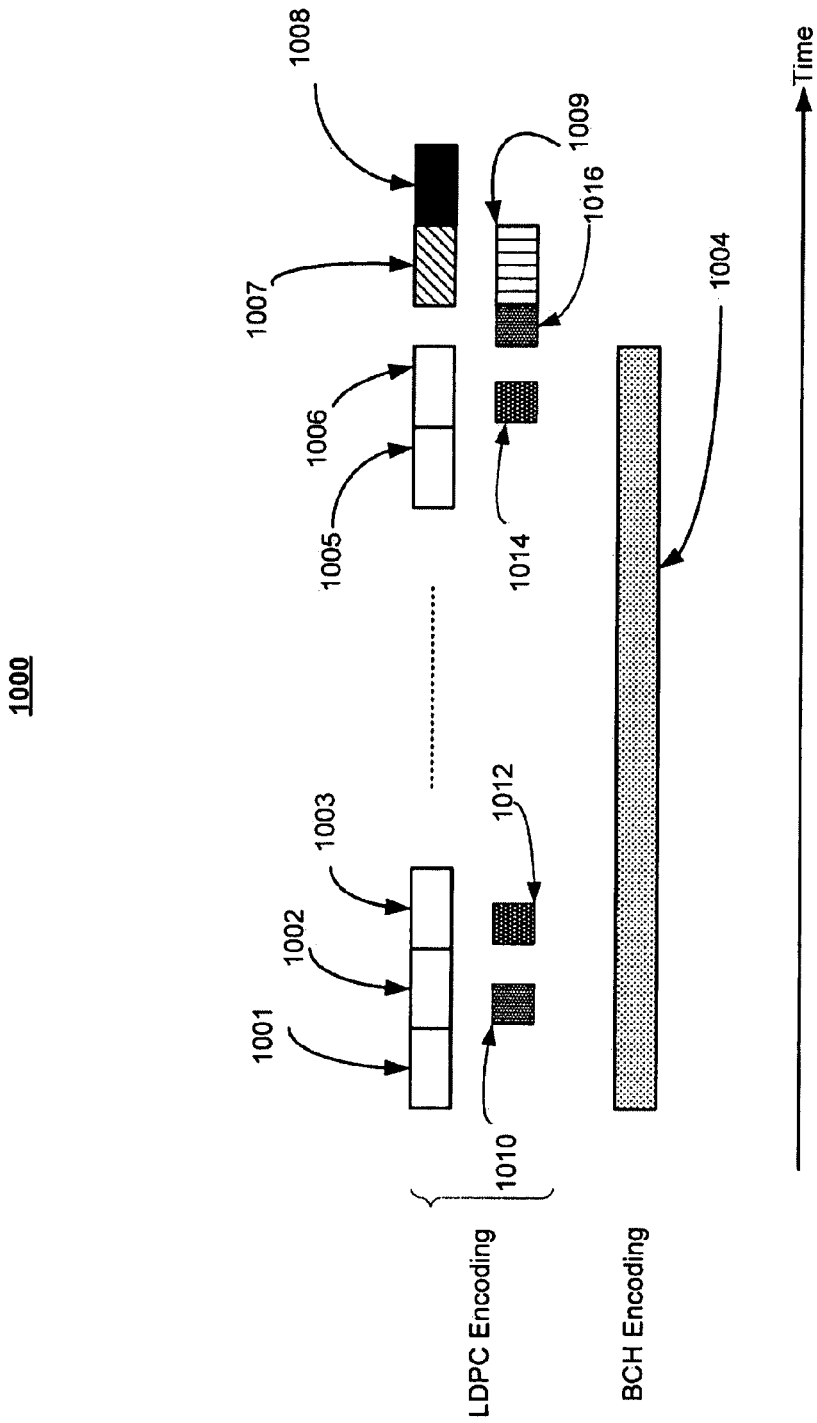
FIG. 10. shows a processing pipeline for an exemplary implementation of a programmable LDPC encoder and a BCH encoder.

FIG. 10 shows a processing pipeline 1000 for an exemplary implementation of a BCH-LDPC encoder, such as BCH-LDPC encoder 800 of FIG. 8 or BCH-LDPC encoder 900 of FIG. 9. In some embodiments, the entries of the BCH parity vector $P_1$ and the entries of the matrix-vector product X may be computed in parallel as shown in the processing pipeline 1000. In particular, pipeline 1000 illustrates the progress of BCH and LDPC encoding over time with the time progression increasing from left to right. Pipeline 1000 includes three parallel paths, the first two paths for LDPC encoding as carried out by LDPC encoding computation unit 905 in FIG. 9, and the final path for BCH encoding as carried out by BCH encoding computation unit 903 in FIG. 9.

Computation of the entries of the X vector in the LDPC codeword can proceed serially in computation stages 1001 for $x_0$, 1002 for $x_1$ 1003 for $x_2$, ..., 1005 for $x_{Nb-2}$, and 1006 for $x_{Nb-1}$. $N_b$ is the number of block rows in the parity check matrix that correspond to the data portion A. Note that these entries include only partial matrix-vector products, as the BCH parity segment has not been considered. Computation of the first entry, $p_0$, in the parity vector P can proceed in parallel (with a one block time-delay) to the computation of the entries of the X vector in stages 1010, 1012, ..., 1014, and 1016. The first entry, $p_0$, may be computed based on the sum of all of the entries of X, i.e., sumX. Thus, stages 1010, 1012, etc. correspond to the retrieve-add-store update mechanism that computes the sum of the entries of X as these entries are made available. For example, the computation performed at stage 1012 can involve adding the M bits of the second entry of X (as computed in stage 1002) with the M bits of the first entry of X (as previously computed in stage 1001). The sumX computations performed in stages 1010, 1012, ..., 1014, however, does not produce the complete sumX value, as the BCH parity segment has not been considered.

Computation of the BCH parity vector proceeds in parallel with LDPC encoding in stage 1004. Note that, in the illustrated operating scenario, all of the blocks in X (for the message segment of the codeword) may be computed while BCH encoding is performed is stage 1004. Similarly, most of the sumX computation can be completed in this time. These computations may not need any of the parity bits computed in stage 1004 to operate, and therefore the parallel nature of the computation may drastically decrease the latency for the LDPC-BCH encoding.

Once BCH encoding in stage 1004 is complete, LDPC encoding can begin processing the BCH parity portion of its parity check matrix. The parity portion processing of the LDPC encoding can proceed in stage 1007. During stage 1007, all of the X entries computed in stages 1001, ..., 1006 may be updated to reflect the values of the BCH parity segment. Thus, once stage 1007 is complete, all of the entries in the matrix-vector product X may be completely computed. Stage 1009 is a transition stage which marks the point in time at which the sumX computation has been completed. During stage 1009, any values that are needed in the back substitution operation to obtain parity vector P may be computed. For example, the result of the sumX computation may be updated based on the BCH parity segment, and can be used to obtain the value of $p_0$, as specified in EQ. 14. Also, if EQS. 15 and 16 are used for the recursion, stage 1016 may additionally involve the computation of $p_{q-1}$, as specified by in EQ. 13. Note that stages 1007 and 1009 may proceed concurrently. This may be beneficial for minimizing latency, as both the entries of X (as completed in stage 1007) and the initial values for the recursion (e.g., $p_0$ and $p_{q-1}$, as computed in stage 1009) may be needed before the back substitution operation can begin in stage 1008. Stage 1008 is the recursive back-substitution stage which results in the generation of the parity vector P, and subsequently, the codeword C.

When all the computations are complete, the BCH-LDPC codeword is generated. In the exemplary embodiments of FIGS. 8 and 9, once P has been computed, output unit 912 of FIG. 9 or output unit 805 of FIG. 8, for example, concatenates the message vector U, the BCH parity segment $P_1$, and the LDPC parity segment $P_2=P$, to create codeword 820, or codeword 920, respectively. In this exemplary embodiment, the implementation may be done using computational units typically found in FPGAs or ASICs.

Referring now to FIGS. 11-17, various exemplary implementations of the present invention are shown.

Figure 11:
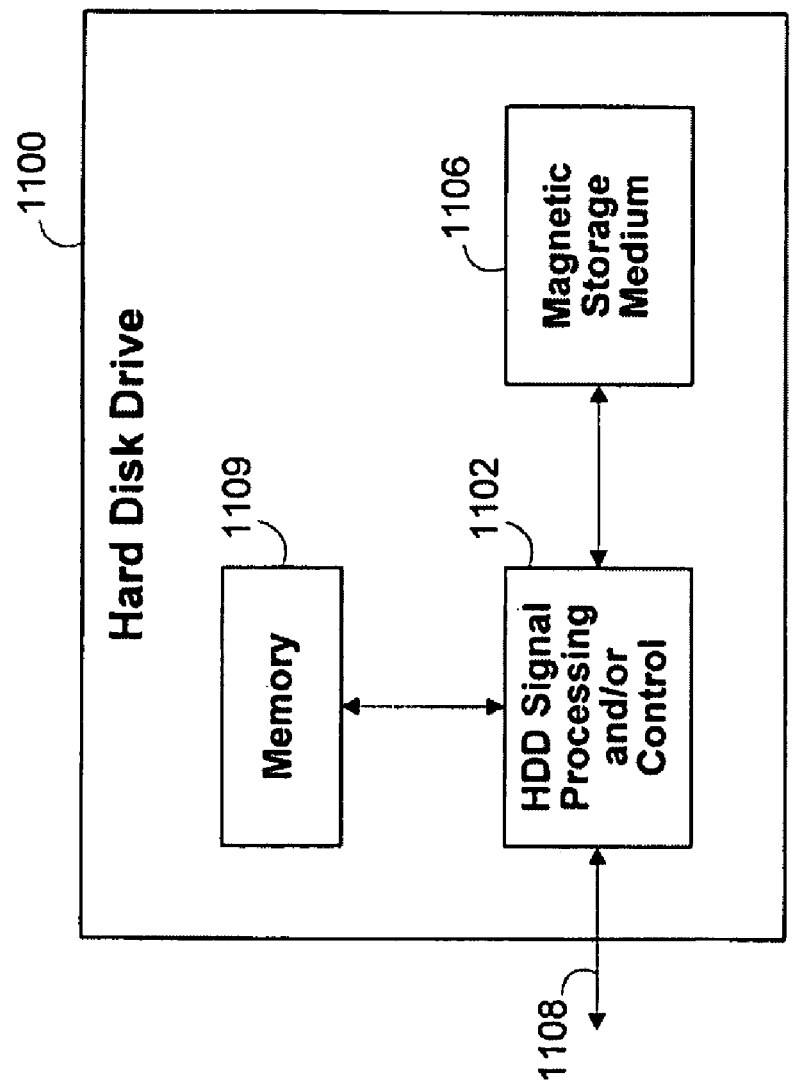
FIG. 11 is a block diagram of an exemplary hard disk drive that can employ the disclosed technology.

Referring now to FIG. 11, the present invention can be implemented in a hard disk drive (HDD) 1100. The present invention may implement either or both signal processing and/or control circuits, which are generally identified in FIG. 11 at 1102. In some implementations, the signal processing and/or control circuit 1102 and/or other circuits (not shown) in the HDD 1100 may process data, perform coding and/or encryption, perform calculations, and/or format data that is output to and/or received from a magnetic storage medium 1106.

The HDD 1100 may communicate with a host device (not shown) such as a computer, mobile computing devices such as personal digital assistants, cellular phones, media or MP3 players and the like, and/or other devices via one or more wired or wireless communication links 1108. The HDD 1100 may be connected to memory 1109 such as random access memory (RAM), nonvolatile memory such as flash memory, read only memory (ROM) and/or other suitable electronic data storage.

Figure 12:
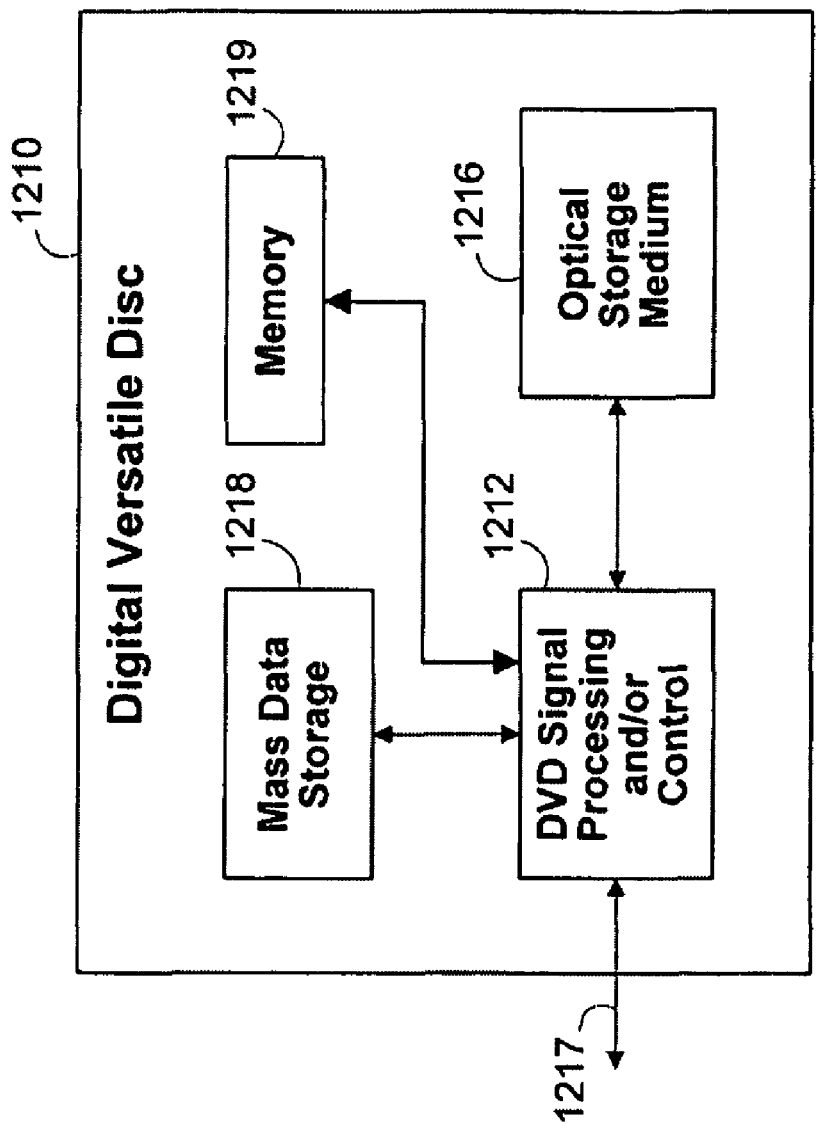
FIG. 12 is a block diagram of an exemplary digital versatile disc drive that can employ the disclosed technology.

Referring now to FIG. 12, the present invention can be implemented in a digital versatile disc (DVD) drive 1210. The present invention may implement either or both signal processing and/or control circuits, which are generally identified in FIG. 12 at 1212, and/or mass data storage 1218 of the DVD drive 1210. The signal processing and/or control circuit 1212 and/or other circuits (not shown) in the DVD drive 1210 may process data, perform coding and/or encryption, perform calculations, and/or format data that is read from and/or data written to an optical storage medium 1216. In some implementations, the signal processing and/or control circuit 1212 and/or other circuits (not shown) in the DVD drive 1210 can also perform other functions such as encoding and/or decoding and/or any other signal processing functions associated with a DVD drive.

The DVD drive 1210 may communicate with an output device (not shown) such as a computer, television or other device via one or more wired or wireless communication links 1217. The DVD drive 1210 may communicate with mass data storage 1218 that stores data in a nonvolatile manner. The mass data storage 1218 may include a hard disk drive (HDD). The HDD may have the configuration shown in FIG. 11. The HDD may be a mini HDD that includes one or more platters having a diameter that is smaller than approximately 1.8". The DVD drive 1210 may be connected to memory 1219 such as RAM, ROM, nonvolatile memory such as flash memory and/or other suitable electronic data storage.

Figure 13:
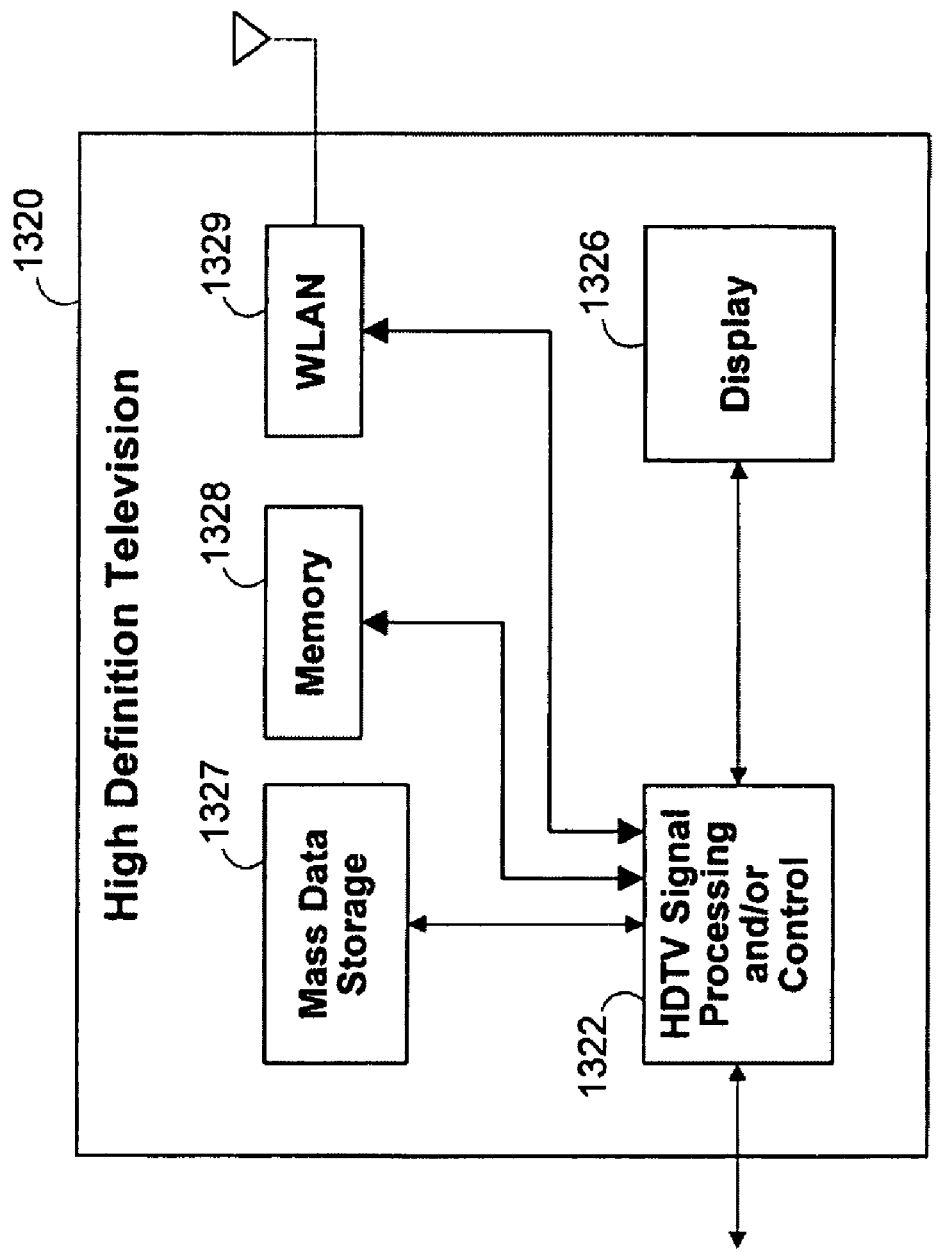
FIG. 13 is a block diagram of an exemplary high definition television that can employ the disclosed technology.

Referring now to FIG. 13, the present invention can be implemented in a high definition television (HDTV) 1320. The present invention may implement either or both signal processing and/or control circuits, which are generally identified in FIG. 13 at 1322, a WLAN network interface 1329 and/or mass data storage 1327 of the HDTV 1320. In one implementation, the HDTV 1320 receives HDTV input signals in either a wired or wireless format and generates HDTV output signals for a display 1326. In some implementations, signal processing circuit and/or control circuit 1322 and/or other circuits (not shown) of the HDTV 1320 may process data, perform coding and/or encryption, perform calculations, format data and/or perform any other type of HDTV processing that may be required.

The HDTV 1320 may communicate with mass data storage 1327 that stores data in a nonvolatile manner such as optical and/or magnetic storage devices for example hard disk drives and/or DVD drives. At least one HDD may have the configuration shown in FIG. 11 and/or at least one DVD drive may have the configuration shown in FIG. 12. The HDD may be a mini HDD that includes one or more platters having a diameter that is smaller than approximately 1.8". The HDTV 1320 may be connected to memory 1328 such as RAM, ROM, nonvolatile memory such as flash memory and/or other suitable electronic data storage. The HDTV 1320 also may support connections with a WLAN via WLAN network interface 1329.

Figure 14:
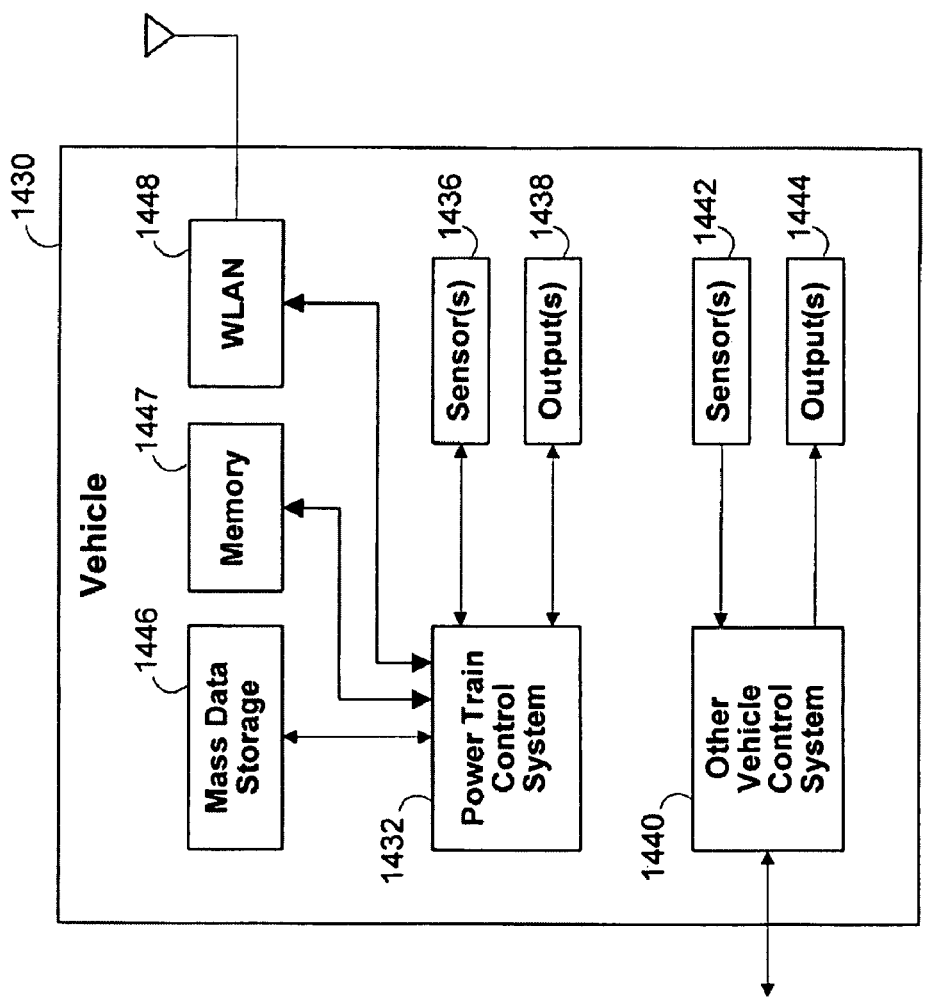
FIG. 14 is a block diagram of an exemplary vehicle that can employ the disclosed technology.

Referring now to FIG. 14, the present invention can be implemented in a control system of a vehicle 1430, a WLAN network interface 1448 and/or mass data storage 1446 of the vehicle 1430. In some implementations, the present invention may be implemented in a powertrain control system 1432 that receives inputs from one or more sensors such as temperature sensors, pressure sensors, rotational sensors, airflow sensors and/or any other suitable sensors and/or that generates one or more output control signals such as engine operating parameters, transmission operating parameters, braking parameters, and/or other control signals.

The present invention may also be implemented in other control systems 1440 of the vehicle 1430. The control system 1440 may likewise receive signals from input sensors 1442 and/or output control signals to one or more output devices 1444. In some implementations, the control system 1440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 1432 may communicate with mass data storage 1446 that stores data in a nonvolatile manner. The mass data storage 1446 may include optical and/or magnetic storage devices for example hard disk drives and/or DVD drives. At least one HDD may have the configuration shown in FIG. 11 and/or at least one DVD drive may have the configuration shown in FIG. 12. The HDD may be a mini HDD that includes one or more platters having a diameter that is smaller than approximately 1.8". The powertrain control system 1432 may be connected to memory 1447 such as RAM, ROM, nonvolatile memory such as flash memory and/or other suitable electronic data storage. The powertrain control system 1432 also may support connections with a WLAN via WLAN network interface 1448. The control system 1440 may also include mass data storage, memory and/or a WLAN network interface (all not shown).

Figure 15:
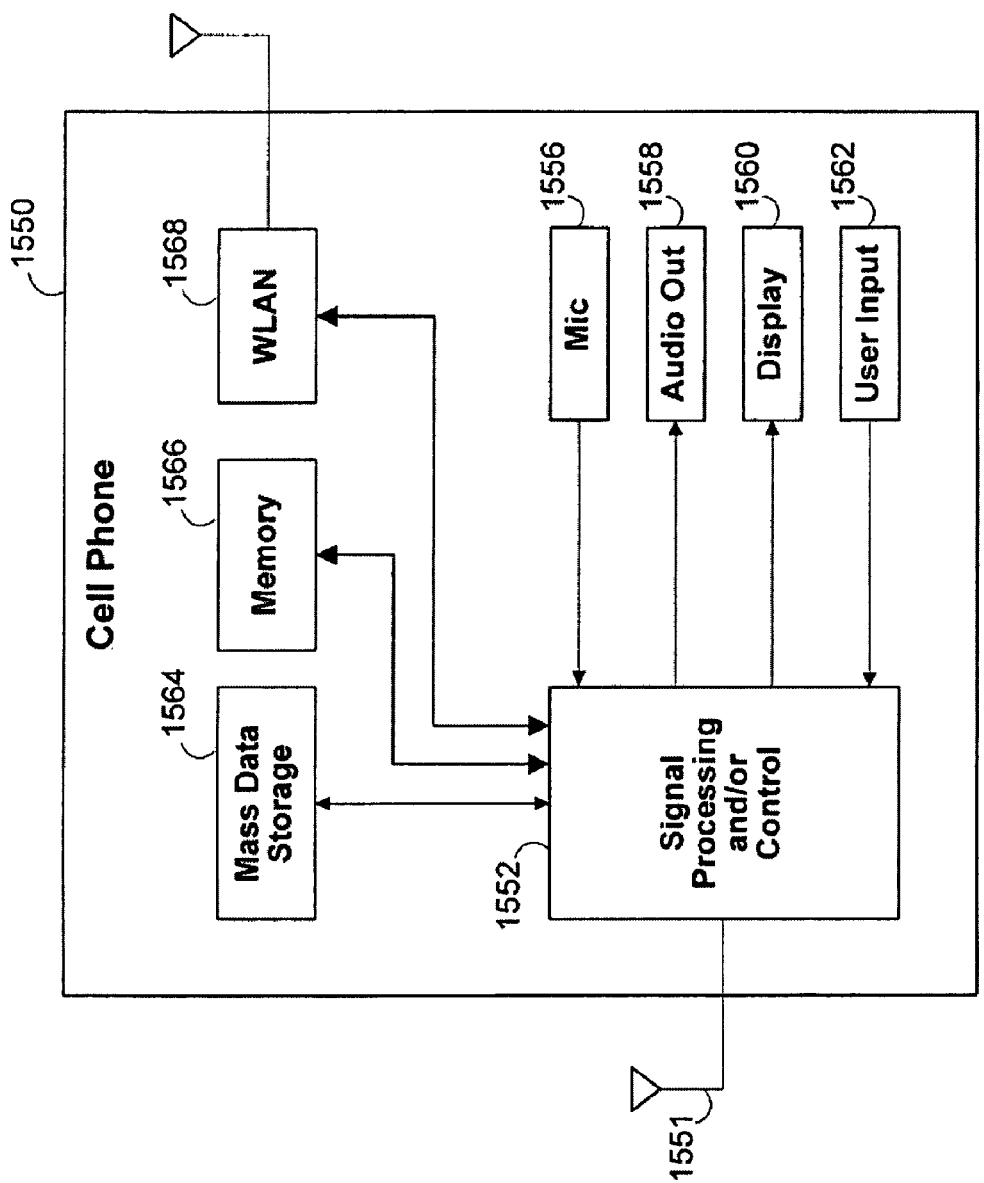
FIG. 15 is a block diagram of an exemplary cellular phone that can employ the disclosed technology.

Referring now to FIG. 15, the present invention can be implemented in a cellular phone 1550 that may include a cellular antenna 1551. The present invention may implement either or both signal processing and/or control circuits, which are generally identified in FIG. 15 at 1552, a WLAN network interface 1568 and/or mass data storage 1564 of the cellular phone 1550. In some implementations, the cellular phone 1550 includes a microphone 1556, an audio output 1558 such as a speaker and/or audio output jack, a display 1560 and/or an input device 1562 such as a keypad, pointing device, voice actuation and/or other input device. The signal processing and/or control circuits 1552 and/or other circuits (not shown) in the cellular phone 1550 may process data, perform coding and/or encryption, perform calculations, format data and/or perform other cellular phone functions.

The cellular phone 1550 may communicate with mass data storage 1564 that stores data in a nonvolatile manner such as optical and/or magnetic storage devices for example hard disk drives and/or DVD drives. At least one HDD may have the configuration shown in FIG. 11 and/or at least one DVD drive may have the configuration shown in FIG. 12. The HDD may be a mini HDD that includes one or more platters having a diameter that is smaller than approximately 1.8". The cellular phone 1550 may be connected to memory 1566 such as RAM, ROM, nonvolatile memory such as flash memory and/or other suitable electronic data storage. The cellular phone 1550 also may support connections with a WLAN via WLAN network interface 1568.

Figure 16:
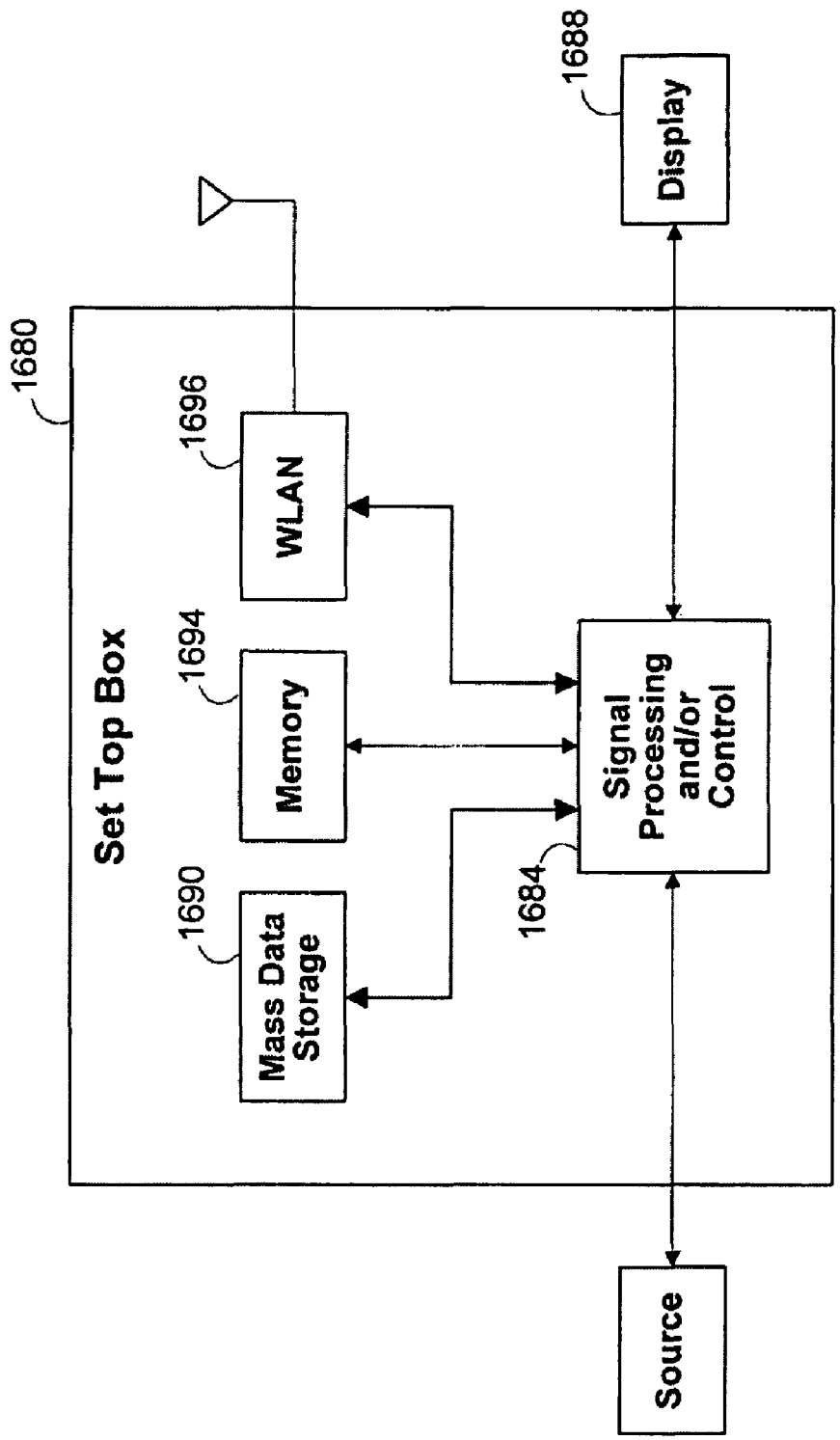
FIG. 16 is a block diagram of an exemplary set top box that can employ the disclosed technology.

Referring now to FIG. 16, the present invention can be implemented in a set top box 1680. The present invention may implement either or both signal processing and/or control circuits, which are generally identified in FIG. 16 at 1684, a WLAN network interface 1696 and/or mass data storage 1690 of the set top box 1680. The set top box 1680 receives signals from a source such as a broadband source and outputs standard and/or high definition audio/video signals suitable for a display 1688 such as a television and/or monitor and/or other video and/or audio output devices. The signal processing and/or control circuits 1684 and/or other circuits (not shown) of the set top box 1680 may process data, perform coding and/or encryption, perform calculations, format data and/or perform any other set top box function.

Set top box 1680 may communicate with mass data storage 1690 that stores data in a nonvolatile manner. The mass data storage 1690 may include optical and/or magnetic storage devices for example hard disk drives and/or DVD drives. At least one HDD may have the configuration shown in FIG. 11 and/or at least one DVD drive may have the configuration shown in FIG. 12. The HDD may be a mini HDD that includes one or more platters having a diameter that is smaller than approximately 1.8". The set top box 1680 may be connected to memory 1694 such as RAM, ROM, nonvolatile memory such as flash memory and/or other suitable electronic data storage. The set top box 1680 also may support connections with a WLAN via WLAN network interface 1696.

Figure 17:
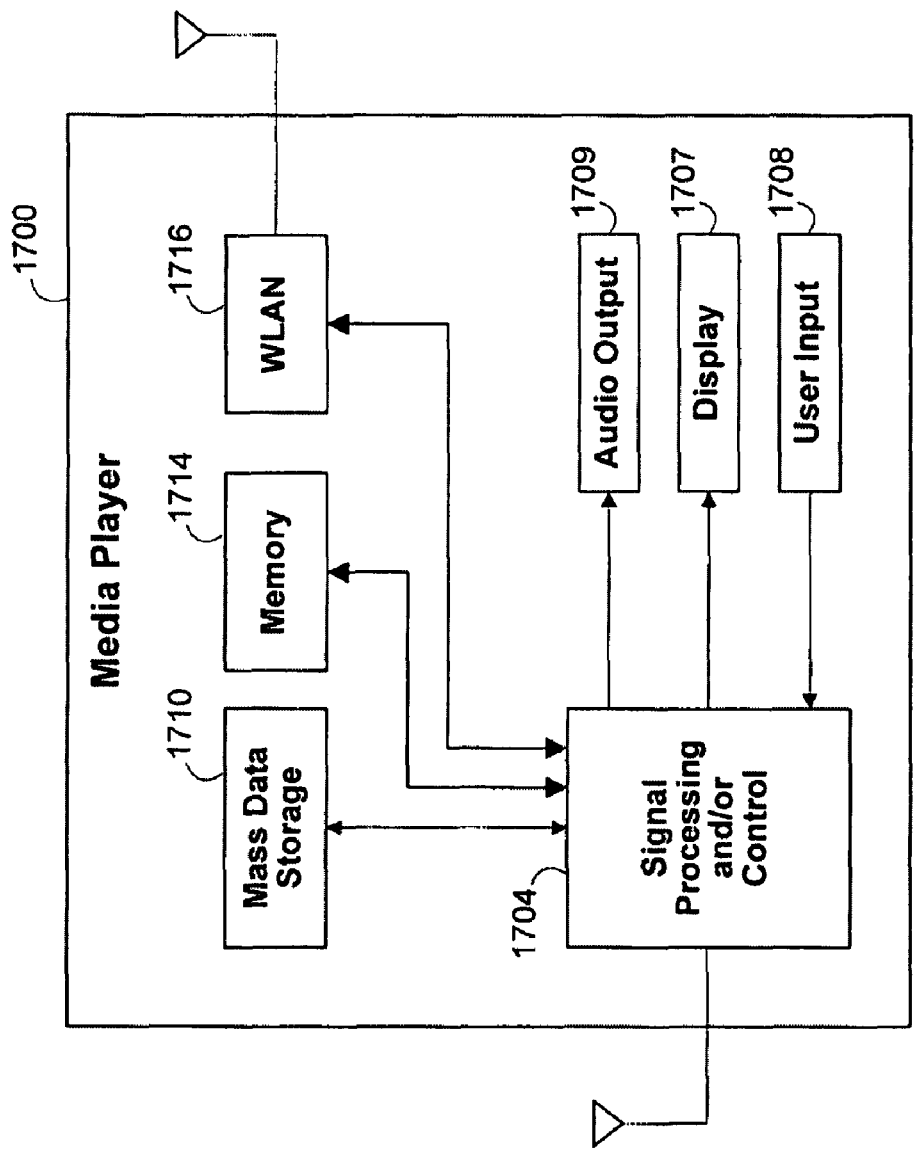
FIG. 17 is a block diagram of an exemplary media player that can employ the disclosed technology.

Referring now to FIG. 17, the present invention can be implemented in a media player 1700. The present invention may implement either or both signal processing and/or control circuits, which are generally identified in FIG. 17 at 1704, a WLAN network interface 1716 and/or mass data storage 1710 of the media player 1700. In some implementations, the media player 1700 includes a display 1707 and/or a user input 1708 such as a keypad, touchpad and the like. In some implementations, the media player 1700 may employ a graphical user interface (GUI) that typically employs menus, drop down menus, icons and/or a point-and-click interface via the display 1707 and/or user input 1708. The media player 1700 further includes an audio output 1709 such as a speaker and/or audio output jack. The signal processing and/or control circuits 1704 and/or other circuits (not shown) of the media player 1700 may process data, perform coding and/or encryption, perform calculations, format data and/or perform any other media player function.

Media player 1700 may communicate with mass data storage 1710 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives and/or DVD drives. At least one HDD may have the configuration shown in FIG. 11 and/or at least one DVD drive may have the configuration shown in FIG. 12. The HDD may be a mini HDD that includes one or more platters having a diameter that is smaller than approximately 1.8". The media player 1700 may be connected to memory 1714 such as RAM, ROM, nonvolatile memory such as flash memory and/or other suitable electronic data storage. The media player 1700 also may support connections with a WLAN via WLAN network interface 1716. Still other implementations in addition to those described above are contemplated.

The foregoing describes systems and methods for low-latency programmable encoders which use low-density parity check (LDPC) codes in combination with an outer systematic code, for example a Bose-Chaudhuri-Hocquenghem (BCH) code. Those skilled in the art will appreciate that the invention can be practiced by other than the described embodiments, which are presented for the purpose of illustration rather than of limitation.

What is claimed is:

1. A method of generating a codeword based on a low-density parity check (LDPC) code, wherein the codeword has a message segment, outer code parity segment, and LDPC parity segment, and wherein the LDPC code is associated with a parity check matrix having a corresponding message portion, outer code parity portion, and LDPC parity portion, the method comprising:
   processing the message segment of the codeword based on the message portion of the parity check matrix in a first time interval;
   processing the outer code parity segment of the codeword based on the outer code parity portion of the parity check matrix in a second time interval subsequent to the first time interval; and
   generating the LDPC parity segment of the codeword from the processed message segment and processed outer code parity segment based on the LDPC parity portion of the parity check matrix.

2. The method of claim 1, wherein processing the message segment of the codeword comprises:
   multiplying the message segment of the codeword and the message portion of the parity check matrix to produce a partial matrix-vector product.

3. The method of claim 2, wherein the partial matrix-vector product is a first partial matrix-vector product, and wherein processing the message segment of the codeword comprises:
   multiplying the outer code parity segment of the codeword and the outer code parity portion of the parity check matrix to produce a second parial matrix-vector product.

4. The method of claim 3, wherein generating the LDPC parity segment of the codeword comprises:
   combining the first partial matrix-vector product and the second partial matrix-vector product to produce a complete matrix-vector product; and
   computing the LDPC parity segment of the codeword based on the complete matrix-vector product.

5. The method of claim 1, wherein generating the codeword comprises performing a back substitution to obtain the LDPC parity segment of the codeword from the LDPC parity portion of the parity check matrix.

6. The method of claim 1, wherein the parity check matrix comprises a plurality of sub-matrices that are each within the message portion, outer code parity portion, or LDPC parity portion of the parity check matrix, and wherein the message segment of the codeword is processed in a plurality of stages that are each associated with one of the sub-matrices in the message portion of the parity check matrix.

7. The method of claim 6, further comprising:
   selecting sub-matrices in a first row of the message portion of the parity check matrix for processing the message segment of the codeword in a first consecutive group of the plurality of stages; and
   selecting sub-matrices in a second row of the message portion of the parity check matrix for processing the message segment of the codeword in a second consecutive group of the plurality of stages.

8. The method of claim 6, wherein the outer code parity segment of the codeword is processed in a plurality of stages that are each associated with one of the sub-matrices in the outer code parity portion of the parity check matrix.

9. The method of claim 6, wherein generating the LDPC parity segment of the codeword comprises:
   accumulating results of each of the plurality of stages; and
   computing the LDPC parity segment of the codeword based on the accumulated results.

10. The method of claim 6, further comprising:
    decomposing each of the sub-matrices into a plurality of sub-sub-matrices, wherein each stage of processing the message segment of the codeword is further divided into a plurality of sub-stages that are computed serially.

11. An encoder for generating a codeword based on a low-density parity check (LDPC) code, wherein the codeword has a message segment, outer code parity segment, and LDPC parity segment, and wherein the LDPC code is associated with a parity check matrix having a corresponding message portion, outer code parity portion, and LDPC parity portion, the encoder comprising:
    computational logic configured to:
       process the message segment of the codeword based on the message portion of the parity check matrix in a first time interval; and
       process the outer code parity segment of the codeword based on the outer code parity portion of the parity check matrix in a second time interval subsequent to the first time interval; and
    a back substitution module configured to generate the LDPC parity segment of the codeword from the processed message segment and processed outer code parity segment based on the LDPC parity portion of the parity check matrix.

12. The encoder of claim 11, wherein the computational logic is further configured to:
    multiply the message segment of the codeword and the message portion of the parity check matrix to produce a partial matrix-vector product.

13. The encoder of claim 11, wherein the partial matrix-vector product is a first partial matrix-vector product, and wherein the computational logic is further configured to:
    multiply the outer code parity segment of the codeword and the outer code parity portion of the parity check matrix to produce a second partial matrix-vector product.

14. The encoder of claim 13, wherein the back substitution module is further configured to:
    combine the first partial matrix-vector product and the second partial matrix-vector product to produce a complete matrix-vector product; and
    compute the LDPC parity segment of the codeword based on the complete matrix-vector product.

15. The encoder of claim 11, wherein the back substitution module is further configured to perform a back substitution to obtain the LDPC parity segment of the codeword from the LDPC parity portion of the parity check matrix.

16. The encoder of claim 11, wherein the parity check matrix comprises a plurality of sub-matrices that are each within the message portion, outer code parity portion, or LDPC parity portion of the parity check matrix, and wherein computational logic is configured to process the message segment of the codeword in a plurality of stages that are each associated with one of the sub-matrices in the message portion of the parity check matrix.

17. The encoder of claim 16, further comprising control logic that interfaces with the computational logic, wherein the control logic is configured to:

select the sub-matrices in a first row of the message portion of the parity check matrix for processing the message segment of the codeword in a first consecutive group of the plurality of stages; and select the sub-matrices in a second row of the message portion of the parity check matrix for processing the message segment of the codeword in a second consecutive group of the plurality of stages.

18. The encoder of claim 16, wherein the computational logic is configured to process the outer code parity segment of the codeword in a plurality of stages that are each associated with one of the sub-matrices in the outer code parity portion of the parity check matrix.

19. The encoder of claim 16, wherein the back substitution module is further configured to:

accumulate results of each of the plurality of stages; and compute the LDPC parity segment of the codeword based on the accumulated results.

20. The encoder of claim 16, further comprising control logic that interfaces with the computational logic, wherein the control logic is configured to:

decompose each of the sub-matrices into a plurality of sub-sub-matrices, and wherein the computational logic is further configured to:

process each stage in a plurality of serial sub-stages that are each associated with a different sub-sub-matrix.

* * * * *